(12) United States Patent
Kim et al.

(10) Patent No.: US 11,537,041 B2
(45) Date of Patent: Dec. 27, 2022

(54) METHOD OF MANUFACTURING SEMICONDUCTOR DEVICE

(71) Applicant: Samsung Electronics Co., Ltd., Suwon-si (KR)

(72) Inventors: Chulho Kim, Seoul (KR); Chorong Park, Seongnam-si (KR); Soohan Kim, Yongin-si (KR); Junghoon Kim, Hwaseong-si (KR); Jeonghun Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 166 days.

(21) Appl. No.: 16/937,266

(22) Filed: Jul. 23, 2020

(65) Prior Publication Data
US 2021/0132489 A1 May 6, 2021

(30) Foreign Application Priority Data
Nov. 4, 2019 (KR) .......... 10-2019-0139737

(51) Int. Cl.
*G03F 1/42* (2012.01)
*H01L 21/66* (2006.01)
*H01L 21/027* (2006.01)
*H01L 23/544* (2006.01)

(52) U.S. Cl.
CPC .......... *G03F 1/42* (2013.01); *H01L 21/0274* (2013.01); *H01L 22/12* (2013.01); *H01L 23/544* (2013.01); *H01L 2223/54426* (2013.01)

(58) Field of Classification Search
CPC ............ G03F 7/70683; G03F 7/70633; G03F 9/7076; G03F 9/7084; G03F 9/7088; H01L 23/544; H01L 2223/54426
See application file for complete search history.

(56) References Cited

U.S. PATENT DOCUMENTS

| | | | |
|---|---|---|---|
| 6,288,454 B1 * | 9/2001 | Allman | G03F 9/7084 257/E23.179 |
| 6,803,292 B2 * | 10/2004 | Kim | G03F 7/70633 356/399 |
| 6,815,128 B2 * | 11/2004 | Rumsey | G03F 9/7076 430/22 |

(Continued)

FOREIGN PATENT DOCUMENTS

| | | |
|---|---|---|
| KR | 10-0519374 B1 | 10/2005 |
| KR | 10-0699109 B1 | 3/2007 |

(Continued)

*Primary Examiner* — Bilkis Jahan
*Assistant Examiner* — Victor V Barzykin
(74) *Attorney, Agent, or Firm* — Muir Patent Law, PLLC

(57) ABSTRACT

A method of manufacturing a semiconductor device includes: forming a first outer box and a second outer box on a wafer, providing a photoresist layer on the wafer; and by removing a portion of the photoresist layer, forming a photoresist pattern including a first opening and a second opening that are horizontally apart from each other, wherein the first opening defines a first inner box superimposed on the first outer box in a plan view, the second opening defines a second inner box superimposed on the second outer box in the plan view, and a horizontal distance between the first opening and the second opening is about 150 μm to about 400 μm.

20 Claims, 28 Drawing Sheets

(56) References Cited

U.S. PATENT DOCUMENTS

| | | | |
|---|---|---|---|
| 6,849,957 B2* | 2/2005 | Takeuchi | H01L 23/544 |
| | | | 257/E23.179 |
| 7,736,844 B2 | 6/2010 | Kim et al. | |
| 8,241,988 B2 | 8/2012 | Kwon et al. | |
| 8,288,242 B2 | 10/2012 | Cho et al. | |
| 8,779,556 B2* | 7/2014 | Chen | G03F 7/70683 |
| | | | 257/E23.179 |
| 9,159,675 B2 | 10/2015 | Han et al. | |
| 9,202,788 B2* | 12/2015 | Okuno | H01L 27/0688 |
| 10,002,806 B2 | 6/2018 | Amir et al. | |
| 2007/0026543 A1* | 2/2007 | Sato | G03F 9/7076 |
| | | | 438/10 |
| 2011/0115057 A1* | 5/2011 | Harn | G03F 9/7084 |
| | | | 257/E23.179 |
| 2012/0299159 A1* | 11/2012 | Chen | H01L 23/544 |
| | | | 257/E23.179 |
| 2014/0312454 A1* | 10/2014 | Chen | H01L 27/0203 |
| | | | 257/499 |
| 2017/0025141 A1 | 1/2017 | Yang et al. | |
| 2017/0148643 A1 | 5/2017 | Ham et al. | |
| 2020/0135841 A1* | 4/2020 | West | G03F 7/20 |

FOREIGN PATENT DOCUMENTS

| KR | 10-2008-0100682 A | 11/2008 |
|---|---|---|
| KR | 10-0871801 B1 | 12/2008 |
| KR | 10-2009-0109352 A | 10/2009 |
| KR | 10-2010-0078468 A | 7/2010 |

\* cited by examiner

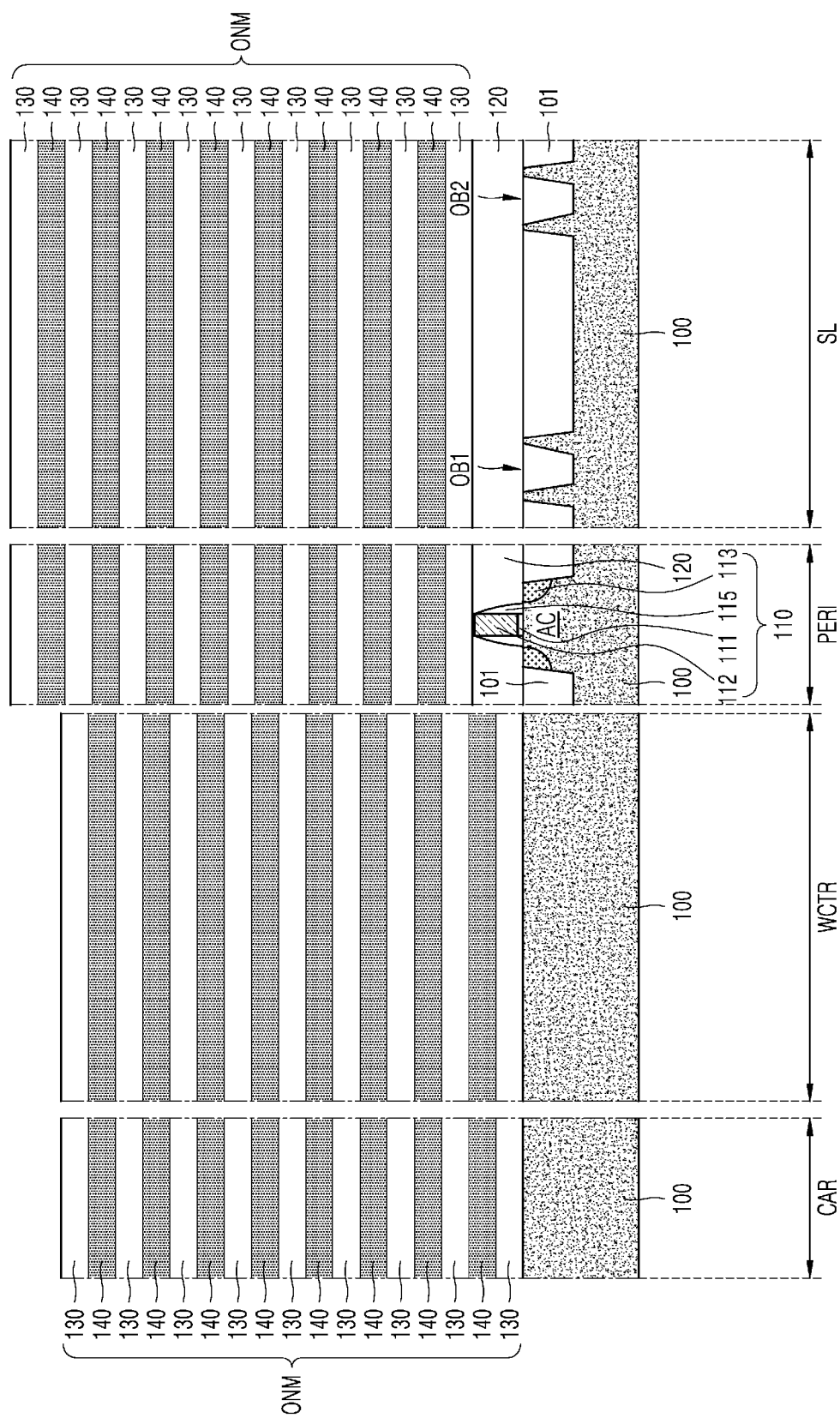

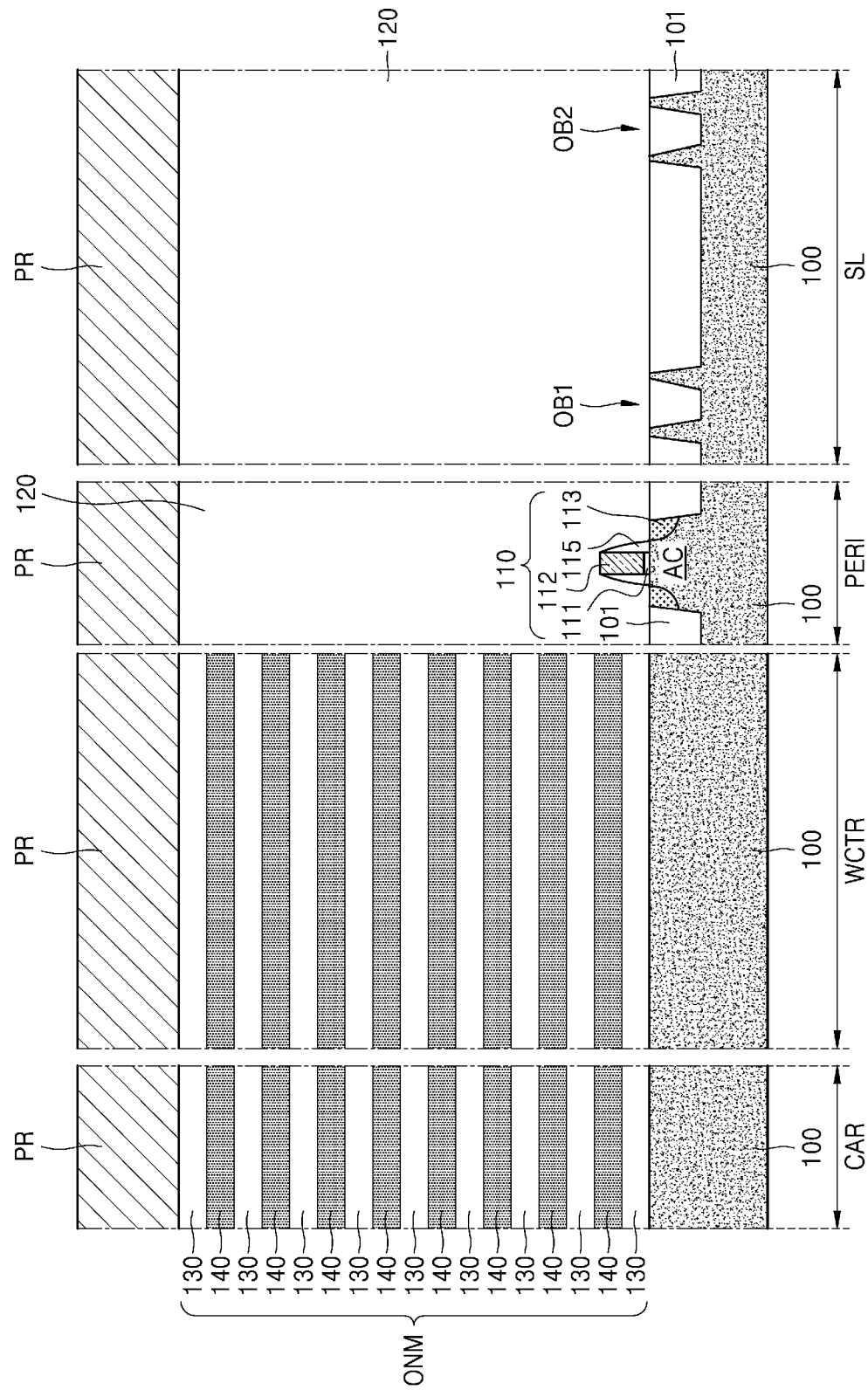

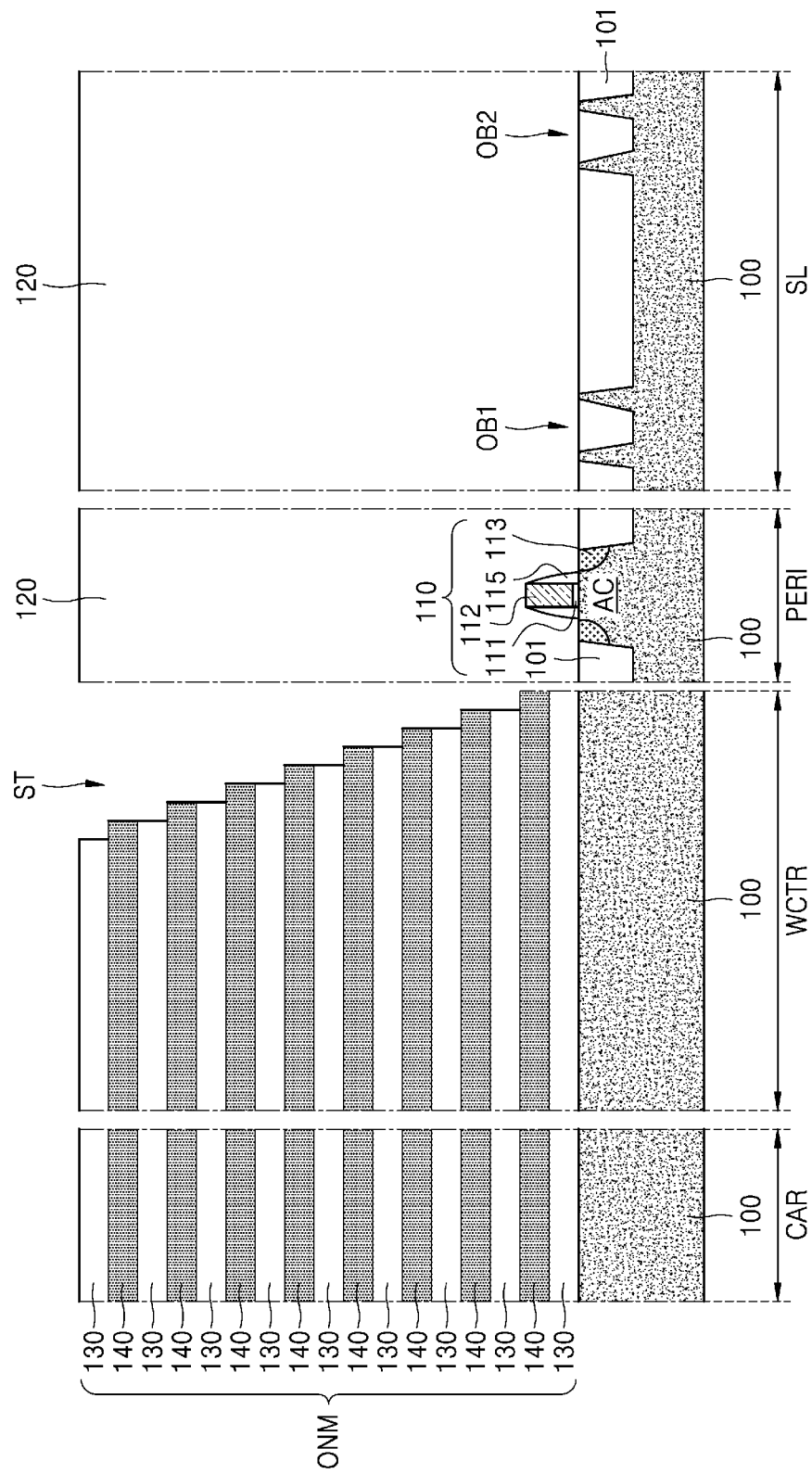

METHOD OF MANUFACTURING SEMICONDUCTOR DEVICE

CROSS-REFERENCE TO RELATED APPLICATION

This application claims priority under 35 U.S.C. § 119 to Korean Patent Application No. 10-2019-0139737, filed on Nov. 4, 2019, in the Korean Intellectual Property Office, the disclosure of which is incorporated herein in its entirety by reference.

BACKGROUND

The technical idea of the inventive concept relates to a method of manufacturing a semiconductor device. More particularly, the inventive concept relates to a method of manufacturing a semiconductor device, the method including a lithography process.

Semiconductor devices are formed by using various manufacturing processes such as a deposition process, an ion implantation process, a lithography process, and an etching process. As semiconductor devices become highly integrated, line widths of patterns included in semiconductor devices are decreasing and aspect ratios of the patterns are increasing. Due to a decrease in the line widths and/or an increase in the aspect ratios, the processes of manufacturing semiconductor devices, in particular, the lithography process, become more difficult. Accordingly, various methods for improving the reliability of the lithography process have been studied.

SUMMARY

The inventive concept provides a method of manufacturing a semiconductor device having high reliability.

The issues to be solved by the technical idea of the inventive concept are not limited to the above-mentioned issues, and other issues not mentioned may be clearly understood by those of ordinary skill in the art from the following descriptions.

According to some embodiments for accomplishing the technical achievements, there is provided a method of manufacturing a semiconductor device. The method includes: forming a first outer box and a second outer box on a wafer; forming an insulating layer covering the first outer box and the second outer box; providing a photoresist layer on the insulating layer; and forming a photoresist pattern by exposing and developing the photoresist layer, wherein the photoresist pattern includes: a first opening exposing a portion of a top surface of the insulating layer, the first opening having a square shape in a top view; a first inner box disposed in the first opening; a first shield exposing a portion of a top surface of the insulating layer and surrounding the first opening; a second opening horizontally apart from the first opening and having a square shape in a top view, the second opening exposing a portion of the top surface of the insulating layer; and a second inner box disposed in the second opening.

According to some other embodiments, a method of manufacturing a semiconductor device includes: forming a first outer box and a second outer box on a wafer; providing a photoresist layer on the wafer; and by removing a portion of the photoresist layer, forming a photoresist pattern including a first opening and a second opening that are horizontally apart from each other, wherein the first opening defines a first inner box superimposed on the first outer box in a plan view, the second opening defines a second inner box superimposed on the second outer box in the plan view, and a horizontal distance between the first opening and the second opening is about 150 µm to about 400 µm.

According to some other embodiments, a method of manufacturing a semiconductor device includes: providing a wafer on which a first full shot, a second full shot, and a scribe lane between the first full shot and the second full shot are defined, wherein a first cell array region, a first word line contact region, and a first peripheral circuit region are defined in the first full shot, and a second cell array region, a second word line contact region, and a second peripheral circuit region are defined in the second full shot; defining an active region on the wafer by using a shallow trench isolation (STI) process; forming peripheral transistors in the first peripheral circuit region and the second peripheral circuit region; providing an ON mold in which eight or more interlayer insulating layers and eight or more sacrificial layers are alternately stacked on the wafer; providing a photoresist layer on the wafer; and forming a photoresist pattern by performing exposing and developing processes onto the photoresist layer, wherein the photoresist pattern includes a first opening defining a first inner box and a second opening defining a second inner box, the first opening and the second opening are formed on the scribe lane, and a distance between the first opening and the second opening is about 150 µm to about 400 µm.

BRIEF DESCRIPTION OF DRAWINGS

Embodiments of the inventive concept will be more clearly understood from the following detailed description taken in conjunction with the accompanying drawings in which.

DETAILED DESCRIPTION OF THE EMBODIMENTS

Figure 1:
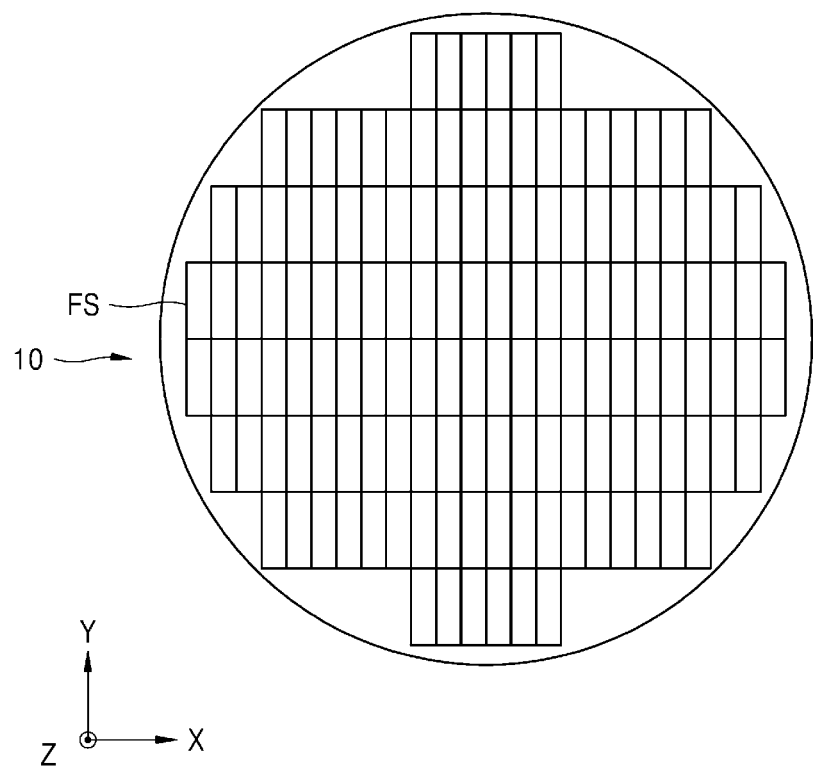
FIG. 1 is a plan view illustrating a wafer including overlay marks according to some embodiments.

Hereinafter, embodiments of the inventive concept will be described in detail with reference to the accompanying drawings. Identical reference numerals are used for the same constituent devices in the drawings, and a duplicate description thereof will be omitted.

FIG. 1 is a plan view illustrating a wafer 10 including a first overlay mark OVM1 and second overlay mark OVM2 (refer to FIG. 2A), according to some embodiments.

Referring to FIG. 1, the wafer 10 may be a wafer on which a lithography process has been performed. In this case, the lithography process may be a process of forming a circuit pattern on the wafer 10. The lithography process may include a spin coating process, an exposure process, and a developing process. The lithography process may be similar to the developing process for film photos. By using the lithography process, the circuit pattern previously formed on an exposure mask may be transferred onto the wafer 10.

The wafer 10 may include, for example, silicon (Si). The wafer 10 may include a semiconductor element such as germanium (Ge), or a compound semiconductor such as silicon carbide (SiC), gallium arsenide (GaAs), and/or indium arsenide (InAs). According to some embodiments, the wafer 10 may have a silicon on insulator (SOI) structure. The wafer 10 may include buried oxide layers. According to some embodiments, the wafer 10 may include a conductive region, for example, a well doped with impurities. In some embodiments, the wafers 10 may have various device isolation structures such as a shallow trench isolation (STI) that separates the doped wells apart from each other.

Hereinafter, a direction perpendicular to a top surface of the wafer 10 may be defined as a Z direction, and two directions parallel with the top surface of the wafer 10 and perpendicular to each other may be defined as an X direction and a Y direction, respectively. Unless particularly stated otherwise, the definition of the directions may be identical in all the drawings and descriptions below.

The spin coating process may be a process of providing a photoresist material to the wafer 10 and then rotating the wafer 10 provided with the photoresist at a high speed. A uniform photoresist layer may be formed on the wafer 10 by the spin coating process. According to some embodiments, in addition to the photoresist layer formed by the spin coating process, an organic planarization layer under the photoresist film, an anti-reflection coating, and a top coating on the photoresist layer, and the like may be further formed.

The spin coating may further include an edge bead removal (EBR) process to remove edge beads. An edge bead may be formed at an edge of the wafer 10, and have a structure in which the photoresist layer has a relatively large thickness. The edge bead may be removed by spraying of organic solvent and laser cleaning.

A pre-exposure measurement may include, for example, identifying positions of alignment marks included in the patterns formed on the wafer 10. Based on the positions of the identified alignment marks, model functions that represent the identified positions of any patterns formed on the wafer 10 may be generated.

Next, an exposure process may be performed on the wafer 10 based on the model function. The exposure process may be performed by using, for example, a KrF laser beam having a wavelength of about 248 nm, an ArF laser beam having a wavelength of about 193 nm, an extreme ultra violet (EUV) beam having a wavelength of about 13.5 nm, and the like. By exposing the patterned beam by a lithographic mask, the circuit pattern formed on the lithographic mask may be transferred to the wafer 10. The exposure process may be either a scanning-type exposure process or a stepping-type exposure process. The scanning-type exposure process may be a continuous transfer method, for example, a line transfer method, and the stepping-type exposure process may be a non-continuous transfer method, for example, a plane transfer method.

A developing process may be a process for removing exposed portion or unexposed portion of a coating layer. The developing process may include spraying developer onto the wafer 10 and then spinning the wafer 10 to coat the developer evenly over the entire surface of the wafer 10, or immersing the wafer 10 in the developer for a certain time. An exposed portion (or non-exposed portion) of a photoresist layer may be removed by the developing process. According to some embodiments, after the developing process, a washing process by using de-ionized water or another cleaning liquid may be further performed to remove contaminated/residual particles.

While the lithography process is performed, a bake process may be performed. The bake process may include a pre-bake process, a post exposure bake (PEB) process, and a hard bake process.

The pre-bake process may be a soft bake process. The soft bake process may be a process for removing organic solvent remaining on the control layer (for example, the photoresist layer), and for strengthening bonding between the control layer (for example, the photoresist layer) and the wafer 10. The soft bake process may be performed at a relatively low temperature.

Since intensity of light becomes uneven due to a standing wave formed during the exposure process, the PEB process may be a process for flattening a curvature formed on a surface of the photoresist layer. The PEB may activate a photo-active compound (PAC) contained in the photoresist layer, and accordingly, the curvature formed on the photoresist layer may be reduced.

The hard bake process may be a process for improving durability against etching and for increasing adhesion to the wafers 10 (or an underlying layer) by curing the photoresist after performing the exposure and development processes. The hard bake process may be performed at a relatively high temperature, compared to the soft bake process.

The wafer 10 may be divided into a plurality of full shots FS. The full shots FS may have substantially rectangular regions. Terms such as "rectangular," "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes. Each of the full shots FS may be an entire lithographic mask region that can be transferred to the wafer 10 (or the photoresist formed on the wafer 10) by using a single exposure process (e.g., by one exposure shot). Circuit patterns formed on different masks from each other may be sequentially transferred onto the full shot FS to form a semiconductor device. For example, a full shot FS may be an area exposed to a certain light pattern using a photomask, and the area may be exposed to multiple light patterns using multiple photomasks to form multiple layers of patterns (e.g., circuit patterns) in the area.

In general, a pattern formed on the lithographic mask may have a larger size than an actual pattern formed on the wafer 10, and thus the pattern formed on the mask may be reduced and transferred onto the wafer 10. Since the patterns actually implemented on the wafer 10 are very fine, it may improve precision of pattern formation by forming a pattern of a larger size on the lithographic mask than the actual pattern transferred to and formed on the wafer.

Figure 2A:
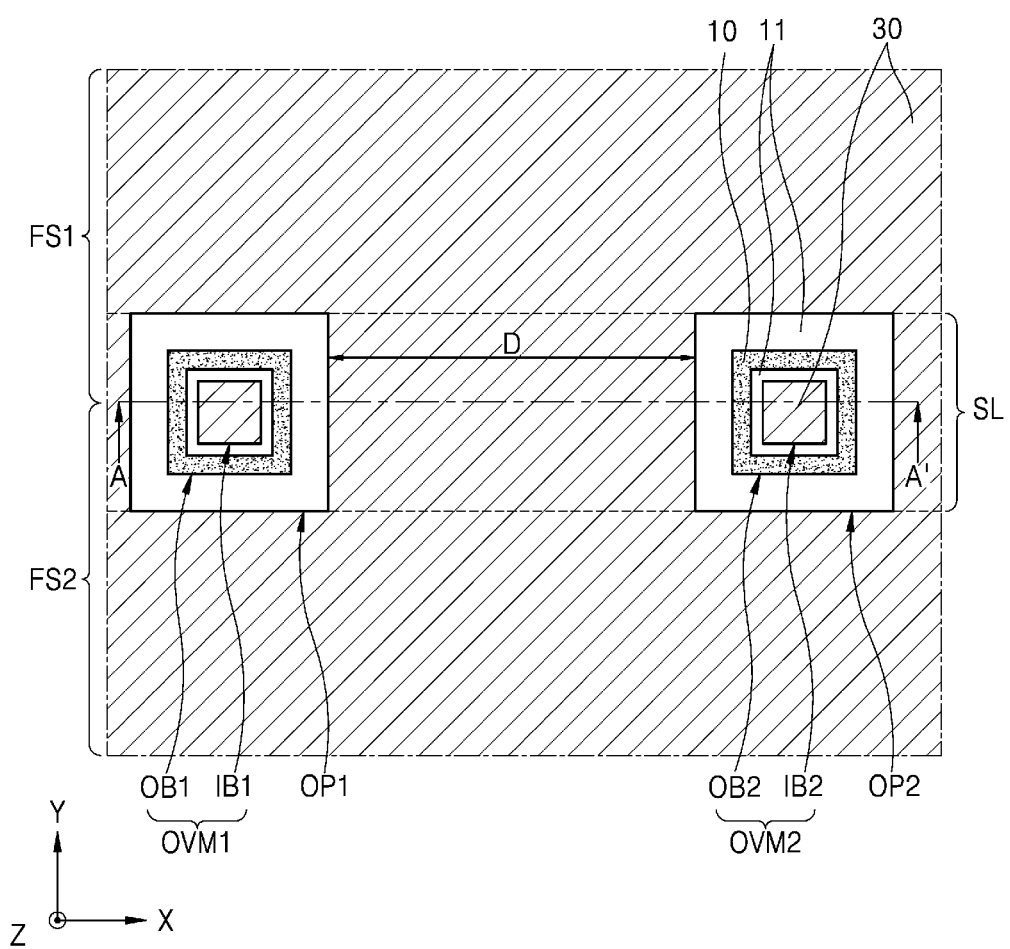
FIG. 2A is a plan view illustrating a first overlay mark and a second overlay mark, according to some embodiments.
Figure 2B:
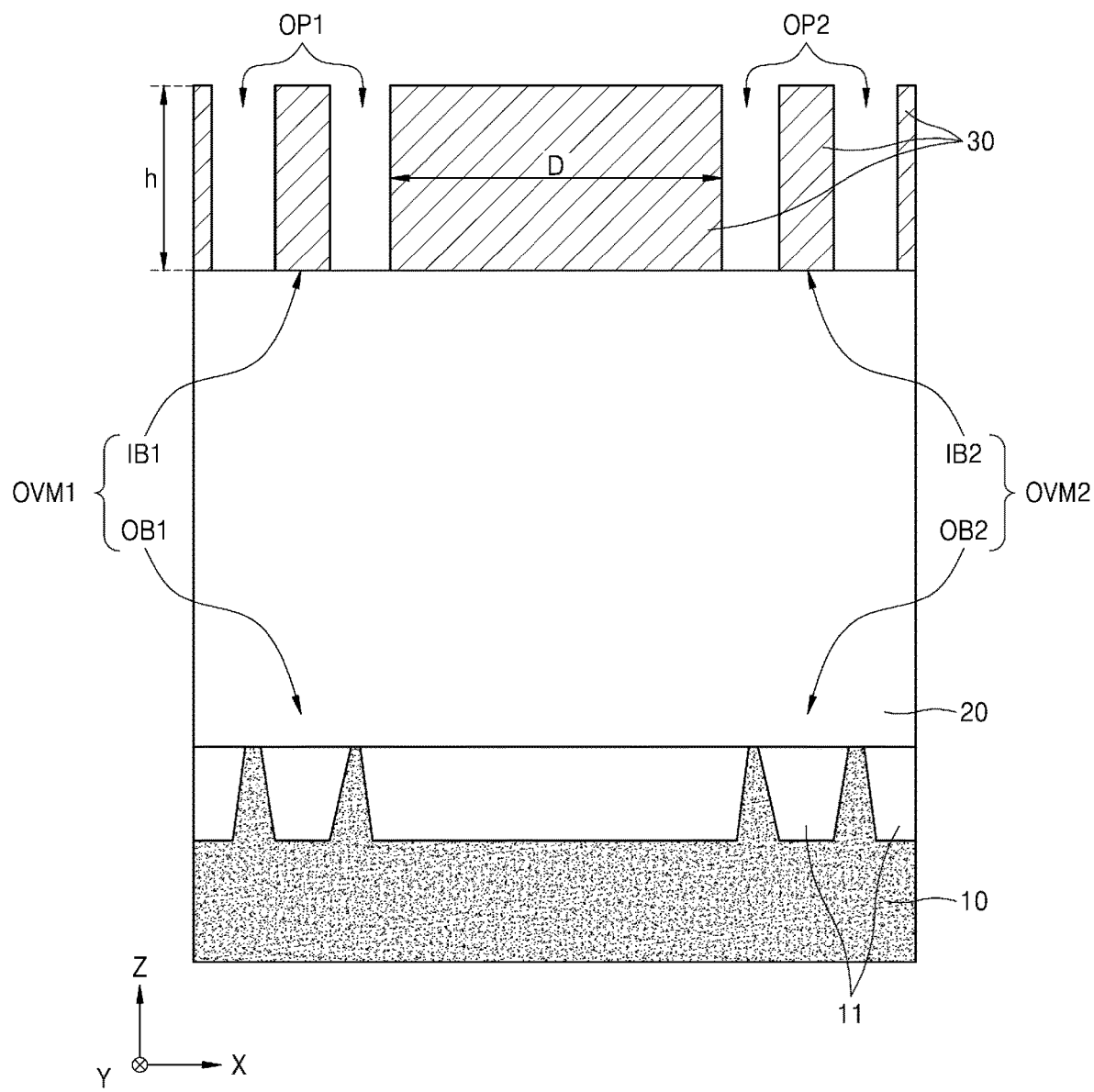
FIG. 2B is a cross-sectional view taken along line A-A' in FIG. 2A.

FIGS. 2A and 2B are diagrams illustrating the first and second overlay marks OVM1 and OVM2, according to some embodiments.

FIG. 2A is a plan view illustrating the first and second overlay marks OVM1 and OVM2 formed on a scribe lane SL that is a boundary between a first full shot FS1 and a second full shot FS2, and FIG. 2B is a cross-sectional view taken along line A-A'.

The first and second full shots FS1 and FS2 in FIG. 2A may be any adjacent full shots FS illustrated in FIG. 1. In FIG. 2A, an insulating layer 20 (illustrated in FIG. 2A) is omitted for clarity of illustration, which is also applicable to subsequent plan views below.

Referring to FIGS. 2A and 2B, the first and second overlay marks OVM1 and OVM2 may be formed on the scribe lane SL. The scribe lane SL may be a separation line for individualization after semiconductor devices are manufactured. The first and second overlay marks OVM1 and OVM2 may be mainly used in the manufacturing process, and they may not be used after the completion of the semiconductor device. Therefore, they may be removed/destroyed in the subsequent individualization process.

After forming the photoresist pattern 30 by using the exposure and development processes, and before the subsequent processes are performed, an overlay may be measured. The term "overlay" may be used herein to describe a degree of alignment of certain overlay patterns with respect to patterns formed on a lower layer. For example, the overlay (degree of alignment of patterns in a certain area—e.g., in a certain full shot FS or a certain part of a full shot FS) may be measured using overlay marks. A first overlay of the first full shot FS1 may be measured by using the first overlay mark OVM1, and a second overlay of the second full shot FS2 may be measured by using the second overlay mark OVM2. By measuring the first and second overlays, a degree of misalignment between pre-formed patterns on the wafer 10 and the photoresist pattern 30 may be determined. For example, the first and second overlay marks OVM1 and OVM2 may be used to measure pattern alignment degrees between a lower layer pattern and an upper layer pattern in the first and second full shots FS1 and FS2. For example, overlay marks (e.g., OVM1, OVM2, etc.) may be references from which alignment degrees between certain lower layer patterns and certain upper layer patterns formed in corresponding full shots FS are estimated/determined.

By using a mismatch between the center of a first inner box IB1 and the center of a first outer box OB1, the first overlay of the first overlay mark OVM1 may be measured. A plurality of first overlay marks OVM1 may be included in the first full shot FS1.

According to some embodiments, an overlay function fitting overlays at a plurality of positions in the full shot FS may be calculated by using an iteration method such as a least square method. Accordingly, the overlay function representing an overlay value according to coordinates may be obtained in the entire full shot FS. In another example, the overlay function for the entire wafer 10 may be obtained.

When the measured overlay is equal to or less than a threshold, likelihood of a circuit defect may be low, and thus a subsequent process (for example, the etching process) may be performed. Since a circuit defect may be caused when the measured overlay is equal to or greater than the threshold, after the photoresist pattern 30 is removed by using a strip process, the lithography process may be performed again. By determining whether the subsequent process is to be performed by using the overlay measurement in this manner, a yield of semiconductor device manufacturing may be improved.

According to some embodiments, the first and second overlay marks OVM1 and OVM2 may have a box in box structure. The first and second overlay marks OVM1 and OVM2 may include a first outer box OB1 and a second outer box OB2, and a first inner box IB1 and a second inner box IB2, respectively. The first inner box IB1 may overlap the first outer box OB1 in a Z direction, and the second inner box IB2 may overlap the second outer box OB2 in the Z direction. Each of the first and second inner boxes IB1 and IB2 may have a relatively small size (for example, a horizontal area) when compared with the first and second outer boxes OB1 and OB2. For example, the first inner box IB1 may be disposed in the first outer box OB1 in a plan view, and the second inner box IB2 may be disposed in the second outer box OB2 in the plan view.

A device isolation layer 11 may be formed on the wafer 10. The device isolation layer 11 may include an oxide (for example, silicon oxide). The device isolation layer 11 may have a shallow trench isolation (STI) structure. The device isolation layer 11 may include an oxide layer for defining an active region and an inactive region. As to be described later, in a chip region CHP (FIG. 13), a region covered by the device isolation layer 11 may be a field region, and a portion not covered by the device isolation layer 11 may be the active region AC (refer to FIG. 15A).

In some embodiments, the first and second outer boxes OB1 and OB2 may be formed at substantially the same level as the wafer 10. For example, the first and second outer boxes OB1 and OB2 may be portions of the wafer 10 that are not covered by the device isolation layer 11. According to some embodiments, the first and second outer boxes OB1 and OB2 may be formed at substantially the same time as an active region AC (refer to FIG. 15A). For example, the first and second outer boxes OB1 and OB2 may be formed by the same process as the active region AC is formed.

The first and second outer boxes OB1 and OB2 may have a hollow square shape. The hollow square shape may be a square having sides and empty inside in a plan view. In certain embodiments, inside of the hollow square may be filled with another material/layer, e.g., the device isolation layer 11 as shown in FIG. 2B. In a top view, each of the first and second outer boxes OB1 and OB2 may surround portions of the device isolation layer 11. Accordingly, outer edges of each of the first and second outer boxes OB1 and OB2 may have a substantially square shape, and may be surrounded by the device isolation layer 11. From the top view, inner edges of each of the first and second outer boxes OB1 and OB2 may have a substantially square shape, and the device isolation device 11 of an island shape may be formed inside the square formed by the inner edges.

The insulating layer 20 may be formed on the wafer 10 and the device isolation layer 11. The insulating layer 20 may include, for example, silicon oxide.

The photoresist pattern 30 may be formed on the insulating layer 20. A height h of the photoresist pattern 30 may be about 40,000 Å or more, or about 130,000 Å or less, but is not limited thereto. The photoresist pattern 30 may include the first and second inner boxes IB1 and IB2.

From the top view, the first and second inner boxes IB1 and IB2 may be surrounded by a first opening OP1 and a second opening OP2, respectively. From the top view, each of the first and second inner boxes IB1 and IB2 may have a solid square. The first and second inner boxes IB1 and IB2 may be defined by the first and second openings OP1 and OP2, respectively. The first and second openings OP1 and OP2 may be spaces in which a photoresist layer is removed to form the photoresist pattern 30 in the development process for forming the first and second inner boxes IB1 and IB2. The first and second openings OP1 and OP2 may vertically overlap the first and second outer boxes OB1 and OB2, respectively. For example, the sides of the squares forming the first and second outer boxes OB1 and OB2 may be respectively disposed in the first and second openings OP1 and OP2 in a plan view.

According to some embodiments, a horizontal area of each of the first and second openings OP1 and OP2 may be greater than that of each of the first and second outer boxes OB1 and OB2, respectively. For example, inner edges and outer edges of the first and second outer boxes OB1 and OB2 may be respectively disposed in the first and second openings OP1 and OP2 in a plan view. According to some embodiments, a horizontal area of each of the device isolation layers 11 surrounded by the first and second outer boxes OB1 and OB2 may be greater than that of each of the first and second inner boxes IB1 and IB2, respectively. The horizontal area of the first and second openings OP1 and OP2 may be defined as an area inside an outer sidewall of the photoresist pattern 30 that defines the first and second openings OP1 and OP2, respectively.

The first and second openings OP1 and OP2 may be apart from each other by a certain distance D. According to some embodiments, a distance D between the first and second openings OP1 and OP2 may be about 150 μm or more. According to some embodiments, the distance D between the first and second openings OP1 and OP2 may be about 155 μm or more. According to some embodiments, a distance D between the first and second openings OP1 and OP2 may be about 200 μm or more. According to some embodiments, a distance D between the first and second openings OP1 and OP2 may be about 400 μm or less. For example, the distance D may be between 150 μm and 400 μm. As to be described later, by making the distance D between the first and second openings OP1 and OP2 equal to or greater than a set value, forming an inclination on the sidewalls of the first and second inner boxes IB1 and IB2 may be improved/prevented. Accordingly, reliability of the method of manufacturing the semiconductor device may be improved.

Figure 3:
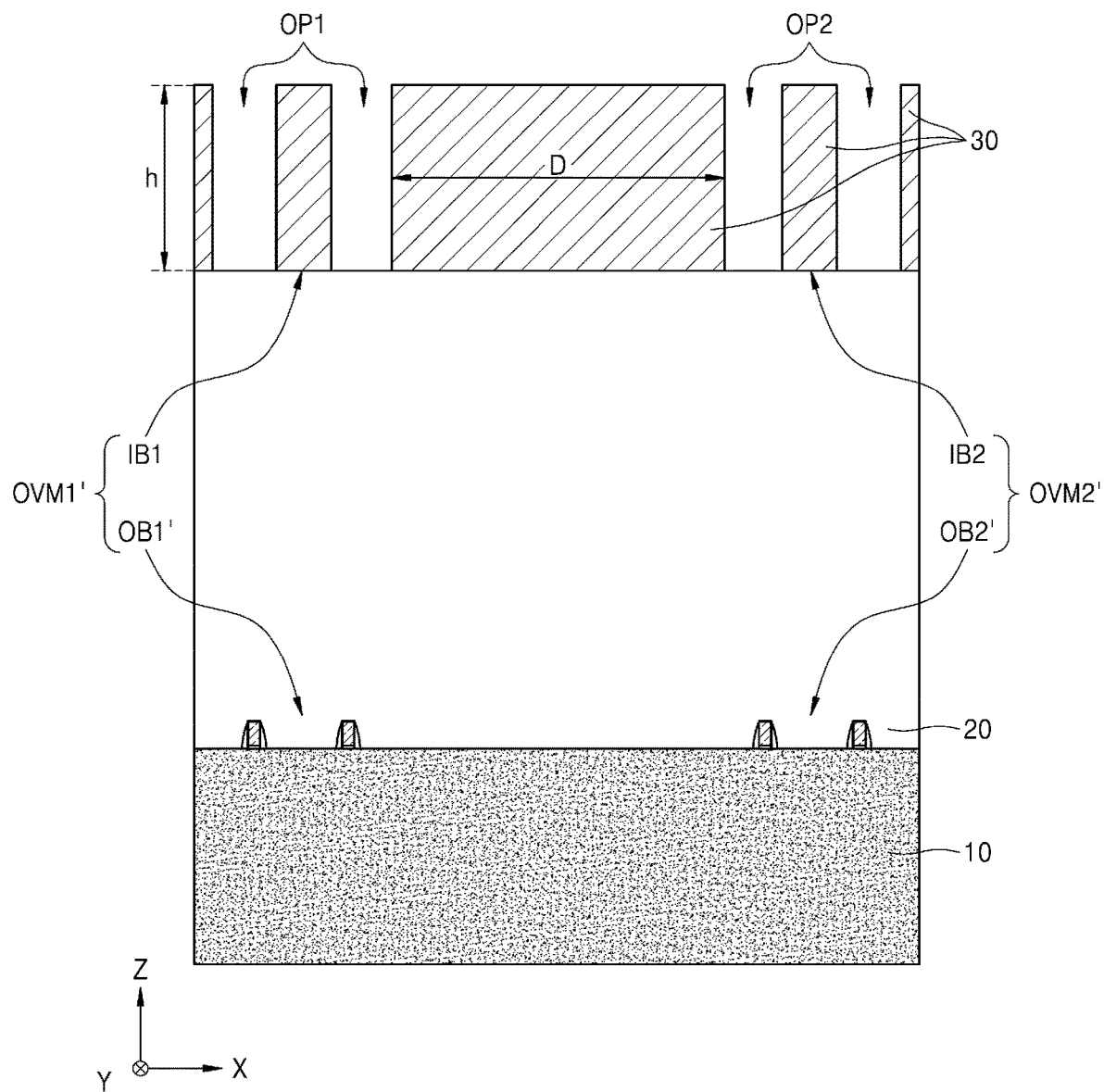
FIG. 3 is a cross-sectional view illustrating a first overlay mark and a second overlay mark, according to some other embodiments.

FIG. 3 is a cross-sectional view illustrating a first overlay mark OVM1' and a second overlay mark OVM2', according to some other embodiments.

For convenience of description, descriptions given with reference to FIGS. 2A and 2B may not be duplicated here and differences from FIGS. 2A and 2B may be mainly described.

Referring to FIG. 3, the first overlay mark OVM1' may include a first inner box IB1 and a first outer box OB1', and the second overlay mark OVM2' may include a second inner box IB2 and a second outer box OB2'.

The first and second outer boxes OB1' and OB2' may be formed in a process of forming a gate of a metal oxide semiconductor field effect transistor (MOSFET). For example, a cross-sectional shape of the first and second outer boxes OB1' and OB2' may be substantially the same as that of the gate of the MOSFET. The first and second outer boxes OB1' and OB2' may include a gate insulating layer, a spacer, and a gate metal layer. The first and second outer boxes OB1' and OB2' may further include a capping layer. The first and second outer boxes OB1' and OB2' may be formed on a top surface of the wafer 10. The first and second outer boxes OB1' and OB2' may be covered by the insulating layer 20. Since the top views of the first and second outer boxes OB1' and OB2' are similar to those described with reference to FIGS. 2A and 2B, detailed descriptions thereof are omitted.

Figure 4:
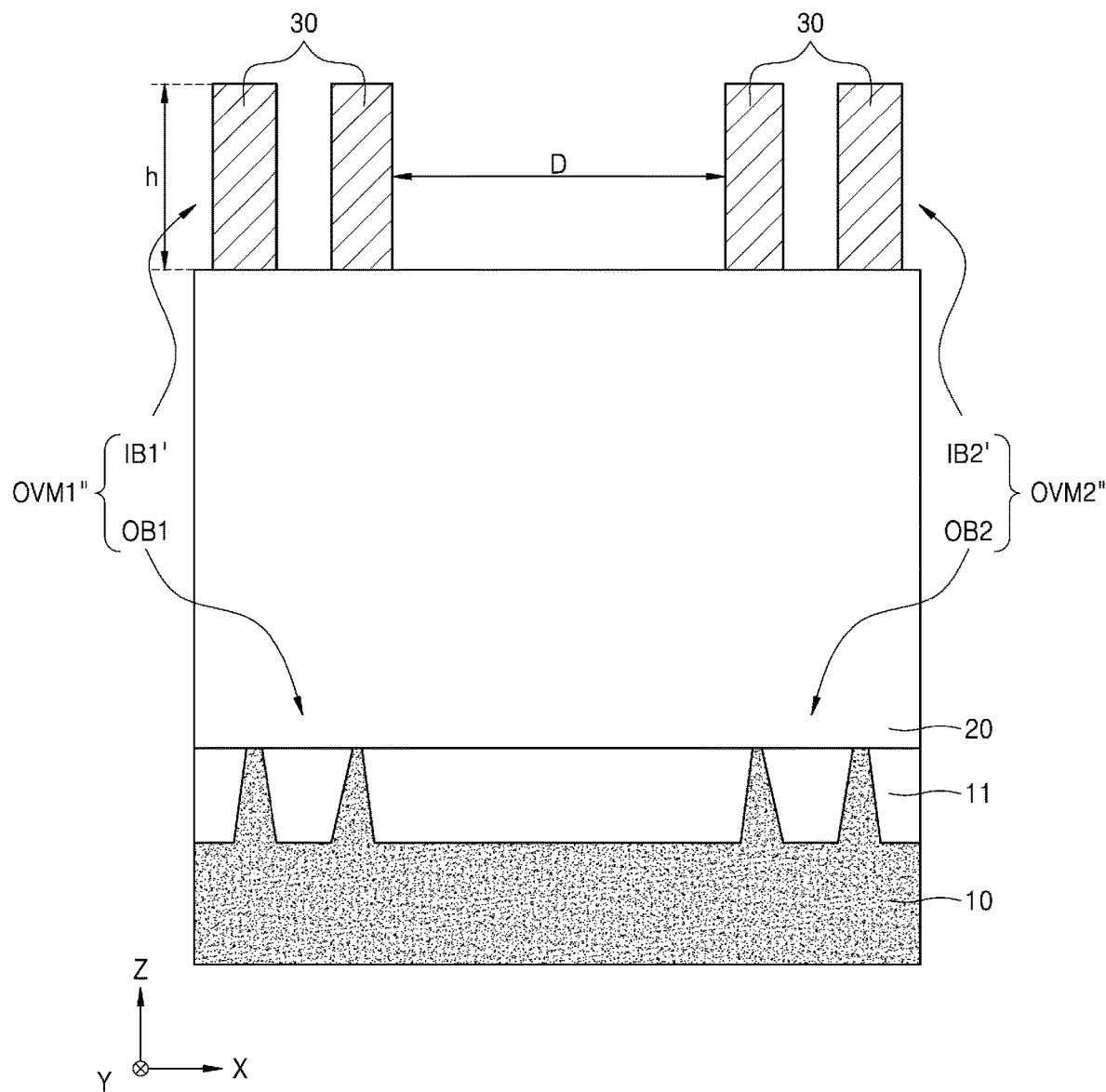
FIG. 4 is a cross-sectional view illustrating a first overlay mark and a second overlay mark, according to some other embodiments.

FIG. 4 is a cross-sectional view illustrating a first overlay mark OVM1" and a second overlay mark OVM2", according to some other embodiments.

For convenience of description, descriptions given with reference to FIGS. 2A and 2B may not be duplicated here and differences from FIGS. 2A and 2B may be mainly described.

Referring to FIG. 4, the first overlay mark OVM1" may include a first inner box IB1' and a first outer box OB1 which are the same as the ones in the previously described embodiments, and the second overlay mark OVM2" may include a second inner box IB2' and a second outer box OB2 which are the same as the ones in the previously described embodiments.

The first and second inner boxes IB1' and IB2' of FIG. 4 may have inverted shapes compared with those of the first and second inner boxes IB1 and IB2 of FIG. 2B. For example, the first and second inner boxes IB1' and IB2' may be portions of the photoresist pattern 30 that have been removed in the developing process. From the top view, the first and second inner boxes IB1' and IB2' may be spaces defined by the photoresist pattern 30. For example, the first and second inner boxes IB1' and IB2' may be open portions of which boundary is defined by side walls of the photoresist pattern 30. From the top view, the photoresist pattern 30 of which side walls defining the first inner box IB1' may be substantially the same as the first opening OP1 in FIG. 2B, and the photoresist pattern 30 of which side walls defining the second inner box IB2' may be substantially the same as the second opening OP2 in FIG. 2B. For example, dimensions of the photoresist patterns 30 surrounding the first and second inner boxes IB1' and IB2' may be respectively the same as the dimensions of the first and second openings OP1 and OP2 of FIG. 2B.

According to some embodiments, the photoresist pattern 30 defining the first inner box IB1' may be apart from the photoresist pattern 30 defining the second inner box IB2' by a distance D'. According to some embodiments, the distance D' may be about 200 μm or more. According to some embodiments, the distance D' may be about 155 μm or more. According to some embodiments, the distance D' may be about 400 μm or less. For example, the distance D' may be between 200 μm and 400 μm.

Figure 5A:
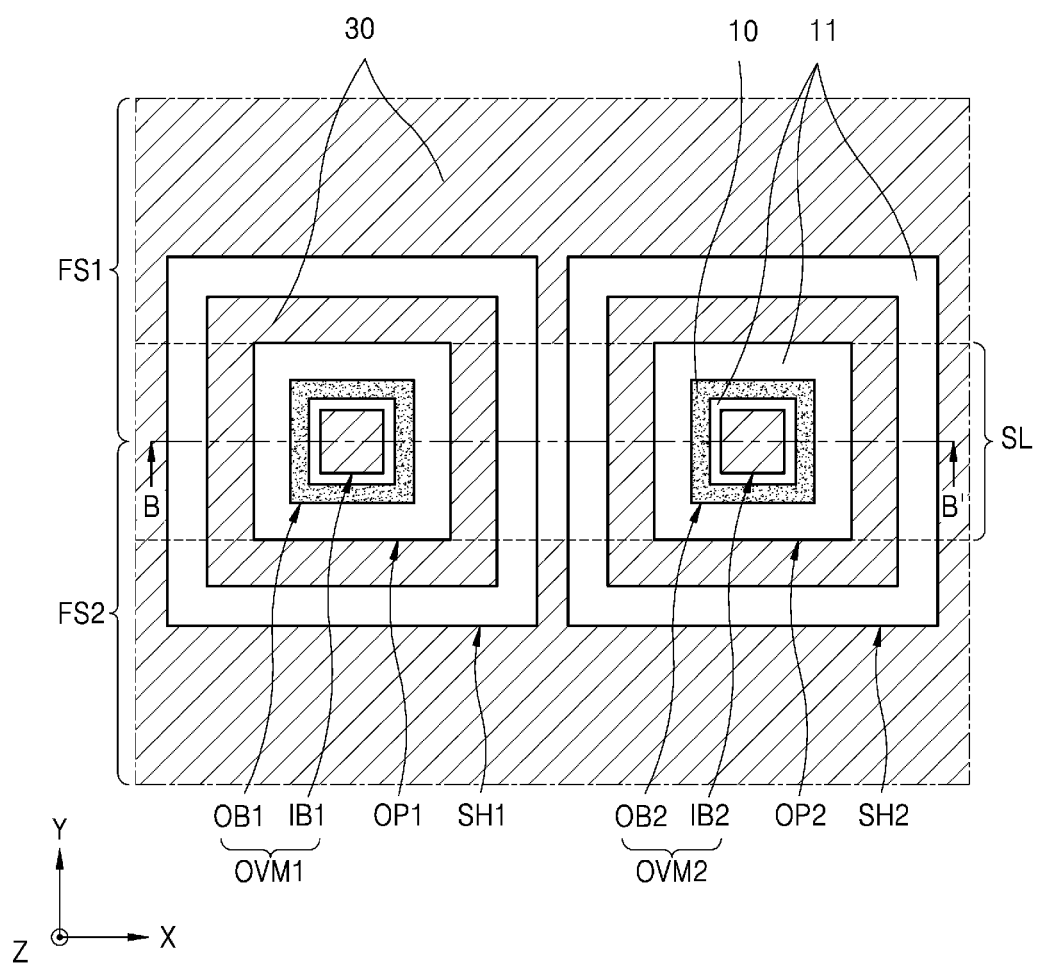
FIG. 5A is a plan view illustrating a first overlay mark and a second overlay mark, according to some other embodiments.
Figure 5B:
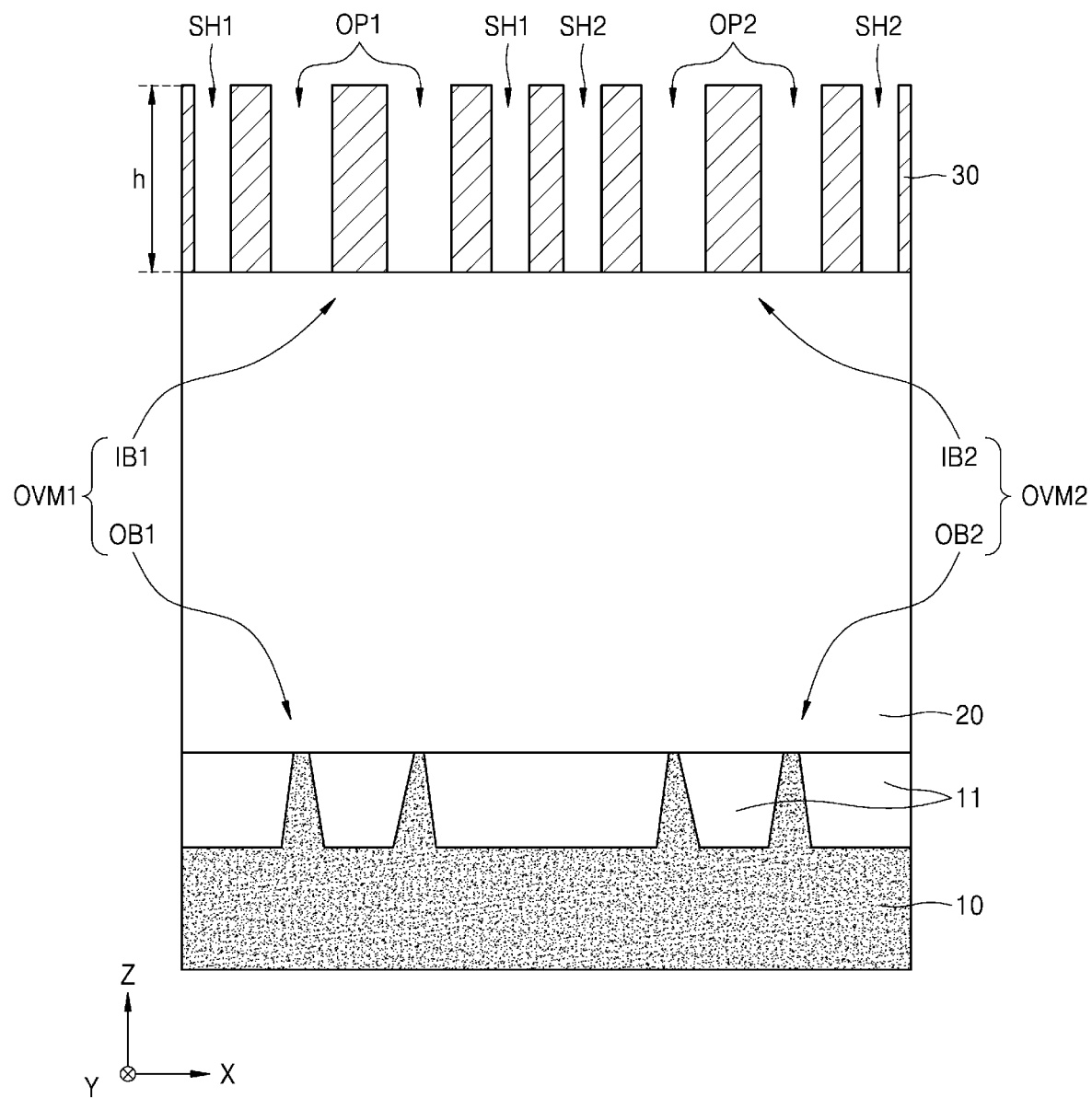
FIG. 5B is a cross-sectional view taken along line B-B' in FIG. 5A.

FIG. 5A is a cross-sectional view illustrating the first and second overlay marks OVM1 and OVM2, according to some other embodiments. FIG. 5B is a cross-sectional view taken along line B-B' in FIG. 5A.

For convenience of description, descriptions given with reference to FIGS. 2A and 2B may not be duplicated here and differences from FIGS. 2A and 2B may be mainly described.

Referring to FIGS. 5A and 5B, the first and second overlay marks OVM1 and OVM2 have substantially the same shape as the first and second overlay marks OVM1 and OVM2 illustrated in FIGS. 2A and 2B, respectively. Referring to FIG. 5, unlike the embodiments illustrated in FIG. 2A, the first overlay mark OVM1 may be surrounded by a first shield SH1, and the second overlay mark OVM2 may be surrounded by a second shield SH2.

In some embodiments, each of the first and second shields SH1 and SH2 may be a portion from which a photoresist layer is removed to form the photoresist pattern 30 by a developing process. The center of the first shield SH1 may be substantially the same as the center of the first inner box IB1. The center of the second shield SH2 may be substantially the same as the center of the second inner box IB2. In this case, that the centers are substantially the same may mean that the centers overlap each other in a vertical direction (the Z direction) or are within a tolerance range in a horizontal direction in a plan view.

According to some embodiments, the first shield SH1 may be formed such that distances of adjacent spaces from the first opening OP1 are the same, and the second shield SH2 may be formed such that distances of adjacent spaces from the second opening OP2 are the same. In this case, the adjacent spaces may be spaces that have been formed while the photoresist material has been removed by the developing process. According to some embodiments, since the distances with respect to the spaces of all portions of each of the first and second openings OP1 and OP2 is constant, e.g., a horizontal width of the photoresist pattern 30 between the first opening OP1 and the first shield SH1 and between the second opening OP2 and the second shield SH2 are constant, inclination of the sidewalls of the first and second inner boxes IB1 and IB2 may be prevented/improved. For example, the first and second shields SH1 and SH2 may have a constant width which is perpendicular to their extending directions while respectively surrounding the first and second openings OP1 and OP2 in a constant distance. This may be helpful to reduce inclination of the inner boxes IB1 and IB2 because respective surroundings of the first and second inner boxes IB1 and IB2 are symmetric with respect to the inner boxes IB1 and IB2.

Figure 6:
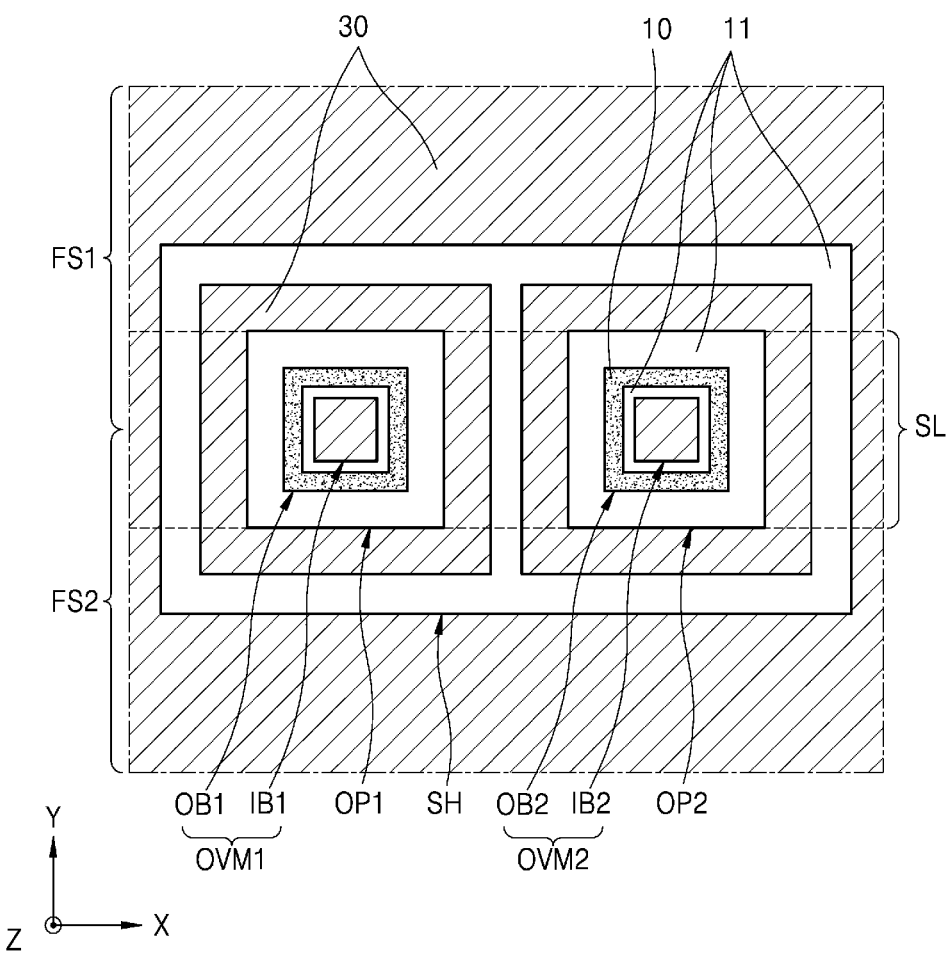
FIG. 6 is a plan view illustrating a first overlay mark and a second overlay mark, according to some other embodiments.

FIG. 6 is a plan view illustrating the first and second overlay marks OVM1 and OVM2, according to some other embodiments.

For convenience of description, descriptions given with reference to FIGS. 5A and 5B may not be duplicated here and differences from FIGS. 5A and 5B may be mainly described.

FIG. 6 illustrates an embodiment similar to embodiments illustrated in FIGS. 5A and 5B, but the first and second inner boxes IB1 and IB2 may be surrounded by one shield SH. From a top view, the shield SH may have an '8' shape.

Figure 7:
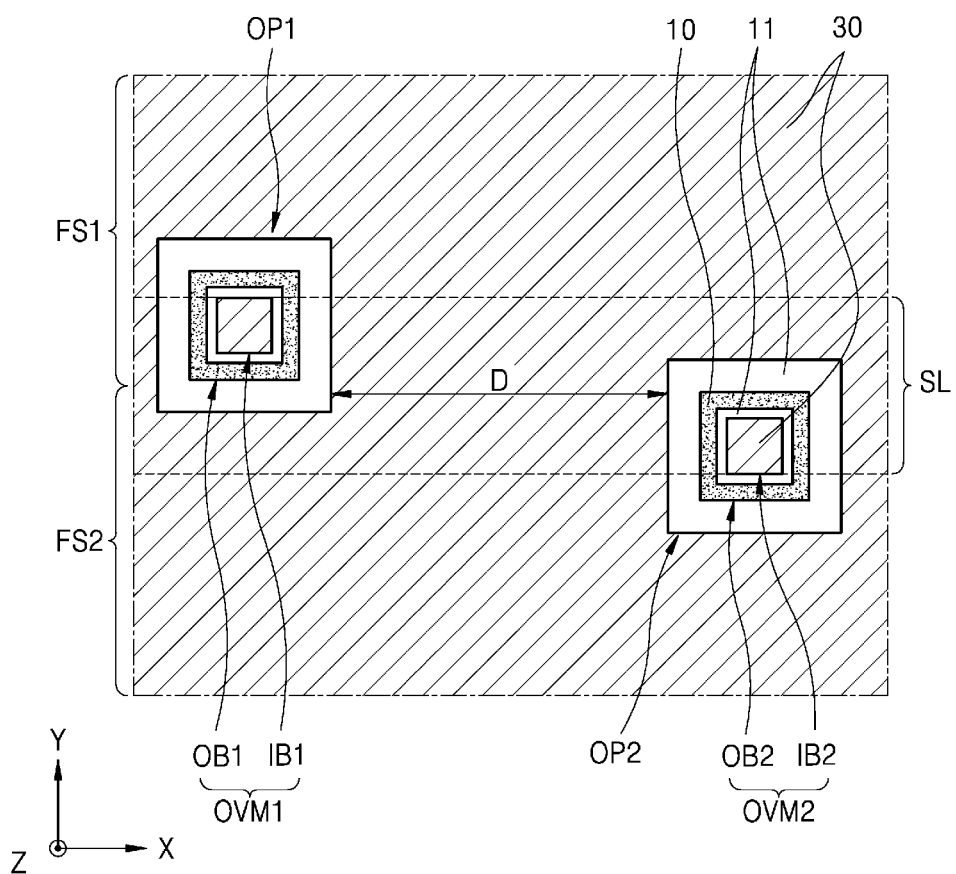
FIG. 7 is a plan view illustrating a first overlay mark and a second overlay mark, according to some other embodiments.

FIG. 7 is a plan view illustrating the first and second overlay marks OVM1 and OVM2, according to some other embodiments.

For convenience of description, descriptions given with reference to FIGS. 2A and 2B may not be duplicated here and differences from FIGS. 2A and 2B may be mainly described.

Referring to FIG. 7, the first and second overlay marks OVM1 and OVM2 may be alternately arranged in the Y direction. For example, the first overlay mark OVM1 may overlap more with a first full shot FS1 than with a second full shot FS2, and the second overlay mark OVM2 may overlap more with the second full shot FS2 than with the first full shot FS1. This may increase the distance between the first and second openings OP1 and OP2, and a degree of freedom in a process design may be improved.

According to some embodiments, at least one of the first and second overlay marks OVM1 and OVM2 may be located in the first full shot FS1 or the second full shot FS2 outside the scribe lane SL. For example, certain overlay marks may be formed within a certain full shot as shown in FIG. 7. In certain embodiments, a portion of the first overlay mark OVM1 and/or a portion of the second overlay mark OVM2 may be located outside the scribe lane SL as shown in FIG. 7.

Figure 8A:
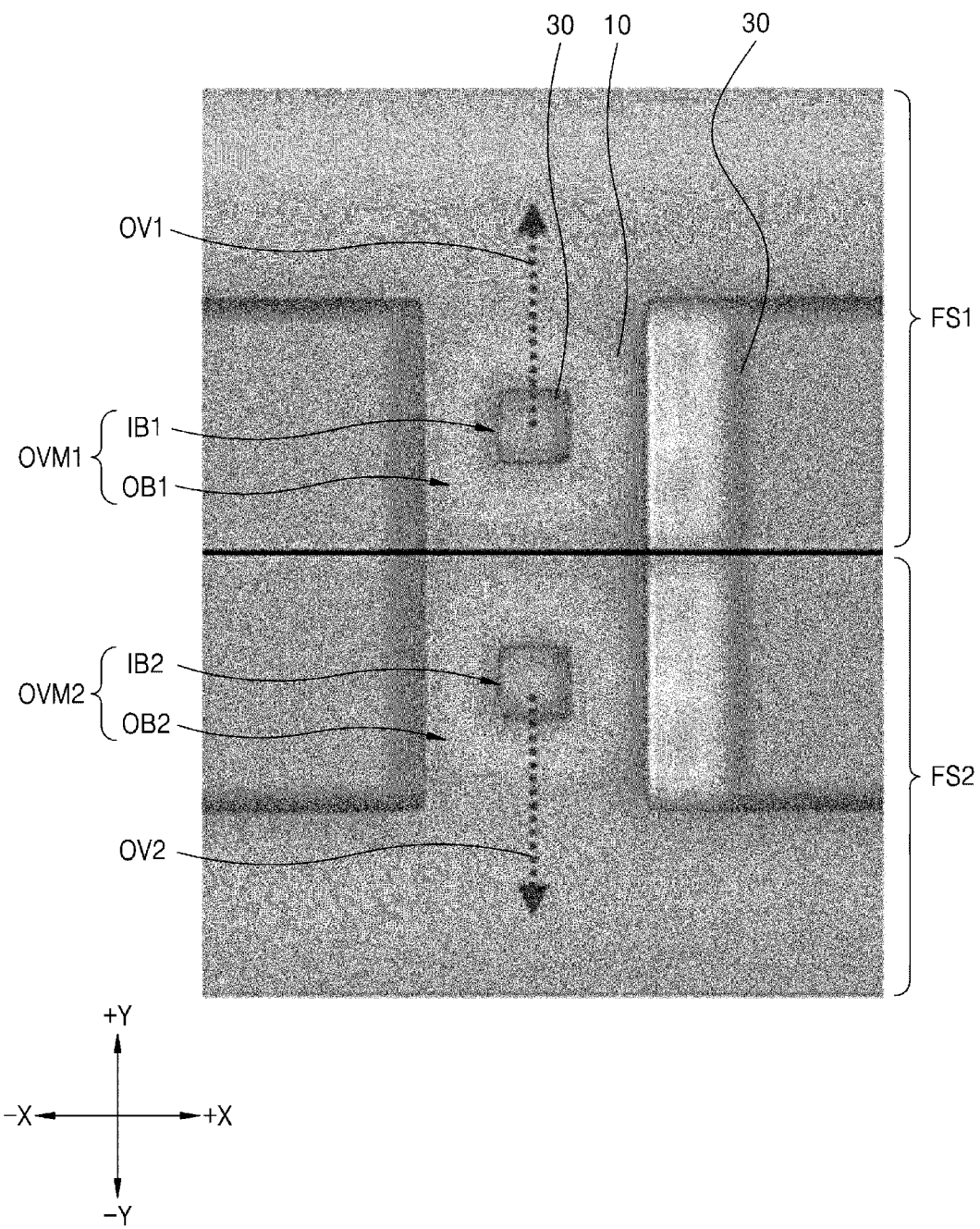
FIGS. 8A through 8F are diagrams illustrating experimental examples for explaining technical effects of some embodiments.
Figure 8B:
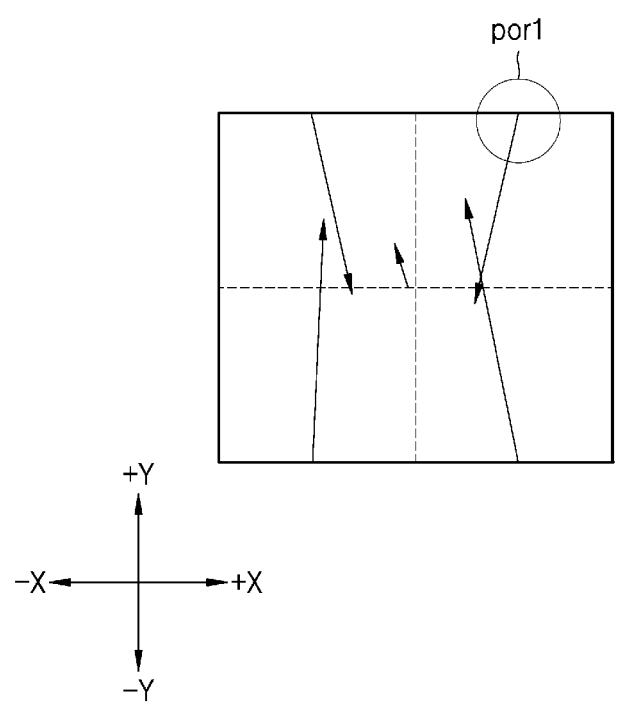
Figure 8C:
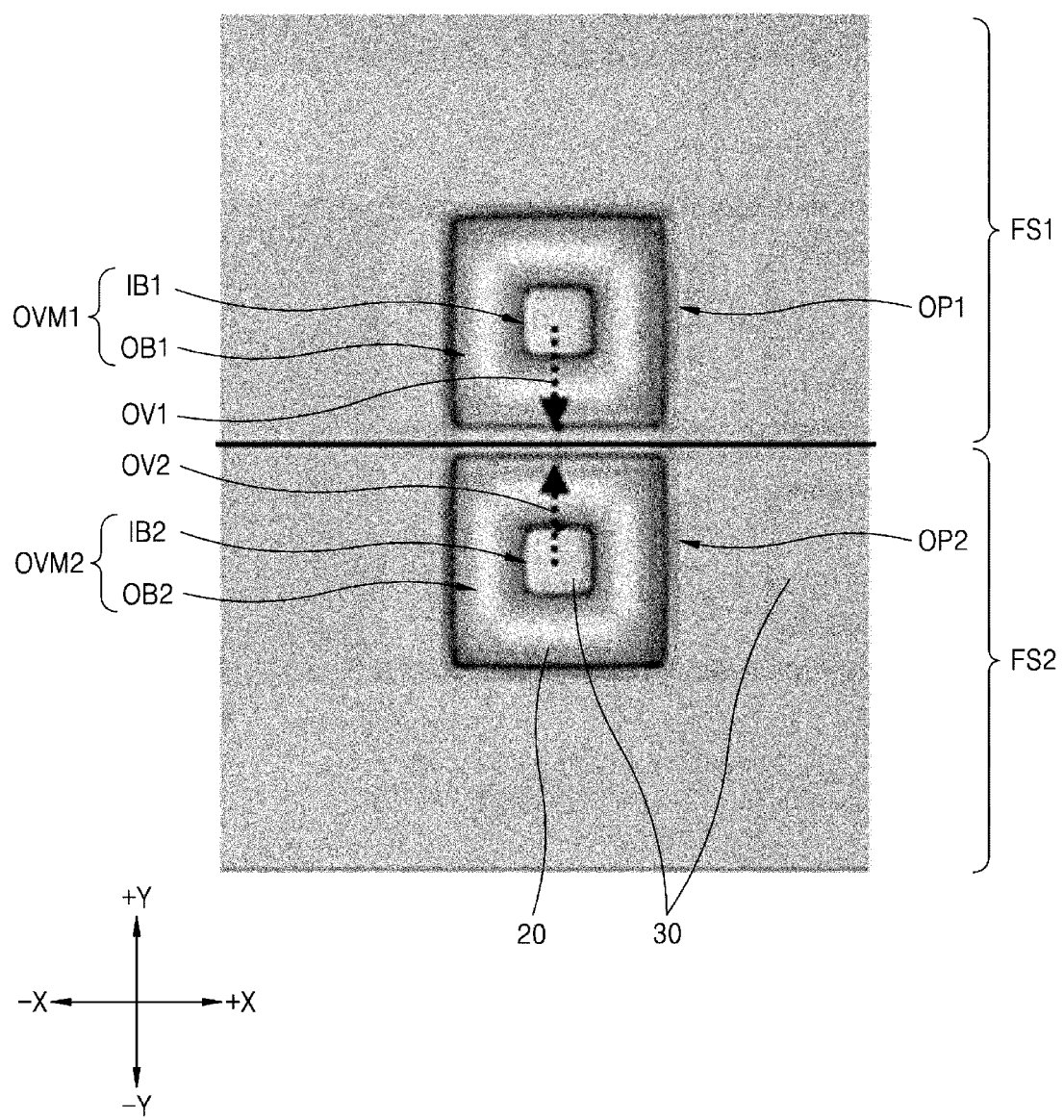
Figure 8D:
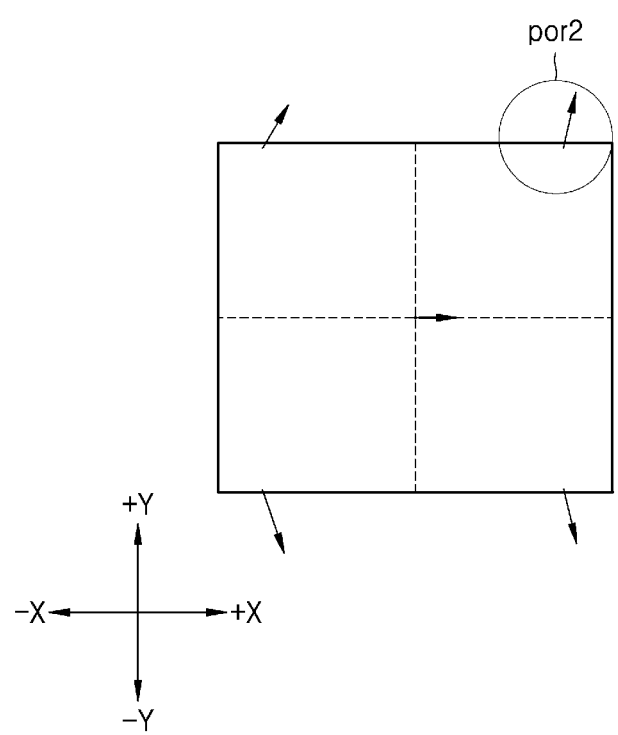
Figure 8E:
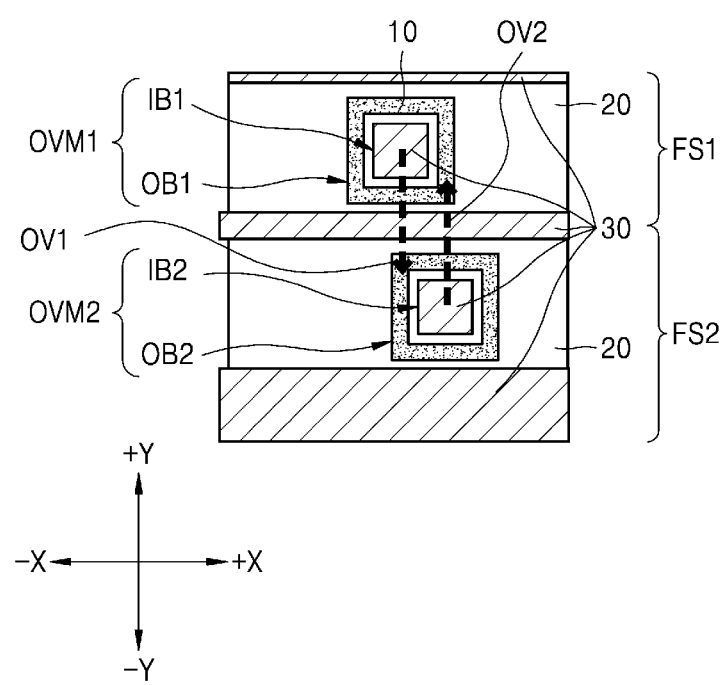
Figure 8F:
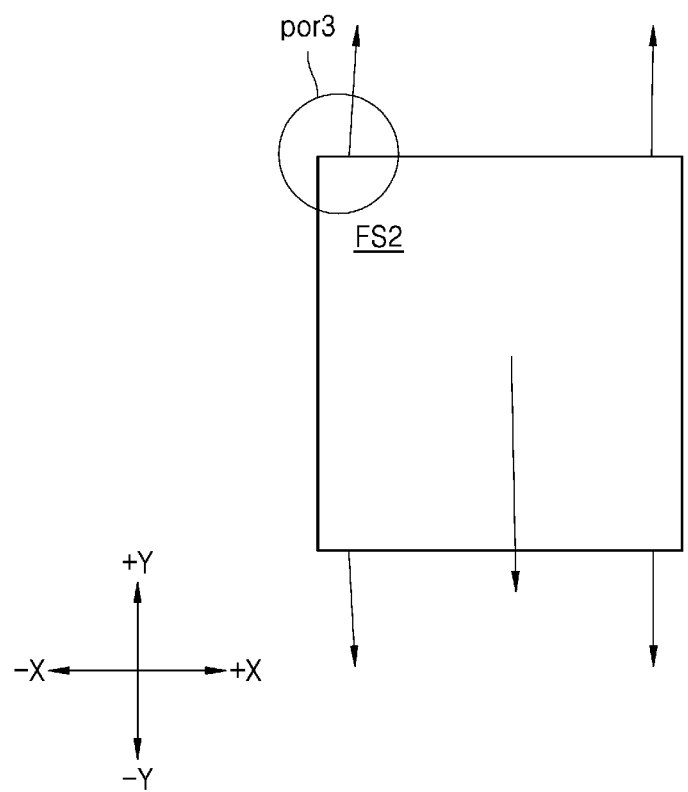

FIGS. 8A through 8F are diagrams illustrating experimental examples for explaining technical effects of some embodiments. FIGS. 8A and 8B are drawings of a first experimental example, FIGS. 8C and 8D are drawings of a second experimental example, and FIGS. 8E and 8F are drawings of a third experimental example, Referring to FIG. 8A, the first overlay mark OVM1 including the first inner box IB1 and the first outer box OB1 is in the first full shot FS1, and the second overlay mark OVM2 including the second inner box IB2 and the second outer box OB2 is in the second full shot FS2.

Referring to FIG. 8A, the photoresist patterns 30 that have not been removed in the developing process may be adjacent to each other in the +X direction and the −X direction with respect to each of the first and second inner boxes IB1 and IB2. For example, the photoresist patterns 30 are formed symmetrically in the ±X direction of the first and second inner boxes IB1 and IB2. Accordingly, surrounding environment in the ±X direction with respect to each of the first and second inner boxes IB1 and IB2 may be symmetrical (for example, a Y-axis symmetry).

While there is a wide open space in the photoresist pattern 30 formed by removing portions of the photoresist layer in the +Y direction with respect to the first inner box IB1, there may be a relatively narrow open space formed by arranging the second inner box IB2 in the −Y direction with respect to the first inner box IB1. Similarly, while there is a wide open space formed by removing the photoresist layer in the −Y direction with respect to the second inner box IB2, there may be a relatively narrow open space formed by arranging the first inner box IB1 in the +Y direction with respect to the second inner box IB2. Accordingly, the surrounding environment in the ±Y direction with respect to each of the first and second inner boxes IB1 and IB2 may be asymmetrical.

FIG. 8B illustrates an overlay map of the second full shot FS2 in FIG. 8A. In this case, the overlay map may represent an overlay vector field distribution determined by the overlay function. For example, the arrows illustrated in FIG. 8B represent vectors of displacements/inclinations of the inner boxes of overlay marks. Referring to FIGS. 8A and 8B, the overlay indicated by an arrow starting from a portion por1 may represent a second overlay OV2 of the second overlay mark OVM2 illustrated in FIG. 8A.

Due to the asymmetry of the surrounding environment, inclination may occur on the side walls of the first and second inner boxes IB1 and IB2. Accordingly, it may have been detected that the first and second overlays OV1 and OV2 are offset in a direction in which the distance between the first and second overlay marks OVM1 and OVM2 further increases. For example, the inner boxes IB1 and IB2 of FIG. 8A may be inclined toward wide open spaces, and the overlay alignment map illustrated in FIG. 8B may indicate that the inner boxes IB1 and IB2 are shifted toward wide open spaces because top surfaces of the inner boxes IB1 and IB2 are displaced from its target position even though bottoms of the inner boxes IB1 and IB2 are formed in the target positions. For example, the overlay map illustrated in FIG. 8B indicates that the first overlay OV1 may be in the +Y direction, and the second overlay OV2 may be in the −Y direction. For example, the first and second overlays OV1 and OV2 may respectively represent displacement directions and displacement distances of the first and second inner boxes IB1 and IB2. For example, the overlay map of FIG. 8B may indicate that photoresist patterns formed in the second full shot FS2 of FIG. 8A are shrunk as represented by arrows starting from sides of the rectangle of the map representing the second full shot F S2 of FIG. 8A.

Referring to FIG. 8C, the first overlay mark OVM1 including the first inner box IB1 and the first outer box OB1 is in the first full shot FS1, and the second overlay mark OVM2 including the second inner box IB2 and the second outer box OB2 is in the second full shot FS2. The bright areas in the first and second overlay marks OVM1 and OVM2 of FIG. 8C show the respective first and second outer boxes OB1 and OB2 formed in a lower layer than the inner boxes IB1 and IB2.

In the experiment example of FIG. 8C, unlike the example of FIG. 8A, only the photoresist of portions corresponding to openings for defining the first and second inner boxes IB1 and IB2 may have been removed. For example, the photoresist pattern 30 remains surround the openings OP1 and OP2 to a certain and enough extent, e.g., for farther than 150 μm. Accordingly, the photoresist pattern 30 having a wide area may surround the first and second inner boxes IB1 and IB2.

The photoresist patterns 30 that have not been removed in the developing process may be adjacent to the first and second inner boxes IB1 and IB2 in the +X direction and the −X direction with respect to each of the first and second inner boxes IB1 and IB2. Accordingly, the surrounding environment in the ±X direction with respect to each of the first and second inner boxes IB1 and IB2 may be symmetrical (for example, a Y-axis symmetry).

While there is only an open space included in the first opening OP1 in the +Y direction with respect to the first inner box IB1, there may be an open space included in the first and second openings OP1 and OP2 in the −Y direction with respect to the first inner box IB1. While there is only an open space included in the second opening OP2 in the −Y direction with respect to the second inner box IB2, there may be an open space included in the first and second openings OP1 and OP2 in the +Y direction with respect to the second inner box IB2. Accordingly, the surrounding environment in the ±Y direction with respect to each of the first and second inner boxes IB1 and IB2 may be asymmetrical.

FIG. 8D illustrates an overlay map of the second full shot FS2 illustrated in FIG. 8C. Referring to FIGS. 8C and 8D, an overlay indicated by an arrow starting from a portion por2 may be a second overlay OV2 of the second overlay mark OVM2 illustrated in FIG. 8C.

Due to the asymmetry of the surrounding environment, inclination may occur on the side walls of the first and second inner boxes IB1 and IB2. Accordingly, it may have been detected that the first and second overlays OV1 and OV2 are offset in a direction in which the distance between the first and second overlay marks OVM1 and OVM2 further decreases. For example, the first overlay OV1 may be in the −Y direction, and the second overlay OV2 may be in the +Y direction. For example, photoresist patterns formed in the second full shot FS2 may be indicated to be expanded as shown in FIG. 8D with arrows starting from sides of a rectangle which represent displacement vectors. This result may be caused by shifted top surfaces of the inner boxes IB1 and IB2 caused by inclination of photoresist patterns 30 of the inner boxes IB1 and IB2 even though bottoms of the inner boxes IB1 and IB2 are formed at intended target areas.

Referring to FIG. 8E, a first overlay mark OVM1 including a first inner box IB1 which is the same as the first inner box IB1 of FIG. 2A and a first outer box OB1 which is the same as the second outer box OB1 of FIG. 2A may be in the first full shot FS1, and a second overlay mark OVM2 including a second inner box IB2 which is the same as the second inner box IB2 of FIG. 2A and a second outer box OB2 which is the same as the second outer box OB2 of FIG. 2A may be in the second full shot FS2.

In the experiment example in FIG. 8E, the first and second overlay marks OVM1 and OVM2 may be alternately arranged in the Y direction. A rod-shaped photoresist pattern 30 extending in the X direction may be further arranged between the first and second overlay marks OVM1 and OVM2. For example, the first and second overlay marks OVM1 and OVM2 may not be aligned with each other in the X direction and/or in the Y direction.

With respect to the first overlay mark OVM1, since there is an open space beyond the rod-shaped photoresist pattern 30 in the −Y direction, while there is the photoresist pattern 30 having a large area in the +Y direction in the chip area of the first full shot FS1 (details are not illustrated here), the surrounding environment in the ±Y direction may be asymmetrical. Similarly, with respect to the second overlay mark OVM2, since there is an open space beyond the rod-shaped photoresist pattern 30 in the +Y direction, while there is the photoresist pattern 30 having a large area in the −Y direction in the chip area of the second full shot FS2, the surrounding environment in the ±Y direction may be asymmetrical. For example, the inner boxes IB1 and IB2 have a tendency to incline toward open spaces as shown by arrows of the first and second overlays OV1 and OV2.

FIG. 8F illustrates an overlay map of the second full shot FS2 in FIG. 8C. Referring to FIGS. 8E and 8F, an overlay indicated by an arrow starting from a portion por3 may be the second overlay OV2 of the second overlay mark OVM2 illustrated in FIG. 8E.

Due to the asymmetry of the surrounding environment, inclination may occur on the side walls of the first and second inner boxes IB1 and IB2. Accordingly, it may have been detected that the first and second overlays OV1 and OV2 are offset in a direction in which the distance between the first and second overlay marks OVM1 and OVM2 further decreases. For example, the first overlay OV1 may be in the −Y direction, and the second overlay OV2 may be in the +Y direction. For example, photoresist patterns formed in the second full shot FS2 may be indicated to be expanded in the +Y direction and in the −Y direction as shown in FIG. 8F with arrows starting from sides of a rectangle which represent displacement vectors in the corresponding positions. This result may be caused by shifted top surfaces of the inner boxes IB1 and IB2 caused by inclination of photoresist patterns 30 of the inner boxes IB1 and IB2 even though bottoms of the inner boxes IB1 and IB2 are formed at intended target positions.

Figure 9:
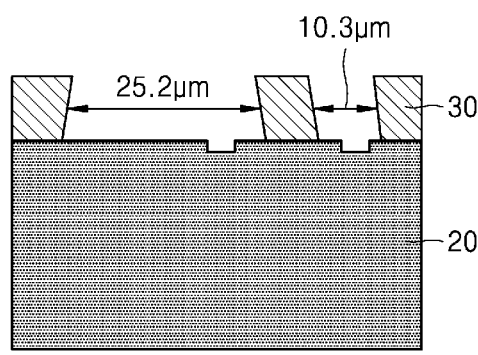
FIG. 9 is a cross-sectional view illustrating results of FIGS. 8A through 8F.

FIG. 9 is a cross-sectional view illustrating an example of results of FIGS. 8A through 8F.

Referring to FIG. 9, the photoresist pattern 30 may include slanted sidewalls. Overall, the first through third experimental examples may show that the sidewalls of the photoresist pattern 30 are inclined in a direction in which a large amount of photoresist material is removed in the asymmetric development process as illustrated in FIG. 9.

Figure 10:
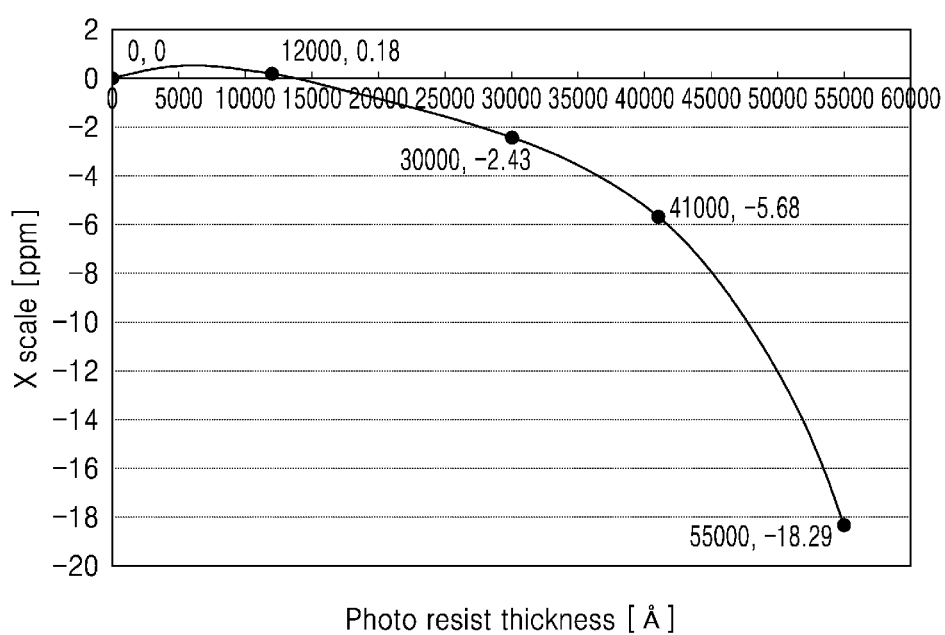
FIG. 10 is a graph illustrating an overlay offset according to a thickness of a photoresist pattern.

FIG. 10 is a graph illustrating an overlay offset according to the thickness of the photoresist pattern 30. For example, FIG. 10 illustrates an experimental result of shifts of top surfaces from bottom surfaces of inner boxes of overlay marks having various thicknesses and having the same layout as the one illustrated in FIG. 8A.

Referring to FIG. 10, overlay offsets are illustrated when the heights of the photoresist patterns are 12,000 Å, 30,000 Å, 41,000 Å, and 55,000 Å, for overlay marks of the same layout as in the experimental example of FIG. 8A.

When the thickness of the photoresist pattern is about 12,000 Å, the offset of the overlay may be about 0.18 ppm. When the thickness of the photoresist pattern is about 30,000 Å, the offset of the overlay may be about −2.43 ppm. When the thickness of the photoresist pattern is about 41,000 Å, the offset of the overlay may be about −5.68 ppm. When the thickness of the photoresist pattern is about 50,000 Å, the offset of the overlay may be about −18.29 ppm. As identified by a trend line illustrated in FIG. 10, the offset of the overlay may increase exponentially as the thickness of the photoresist pattern increases. In this case, 1 ppm corresponds to about 15 nm.

Figure 11:
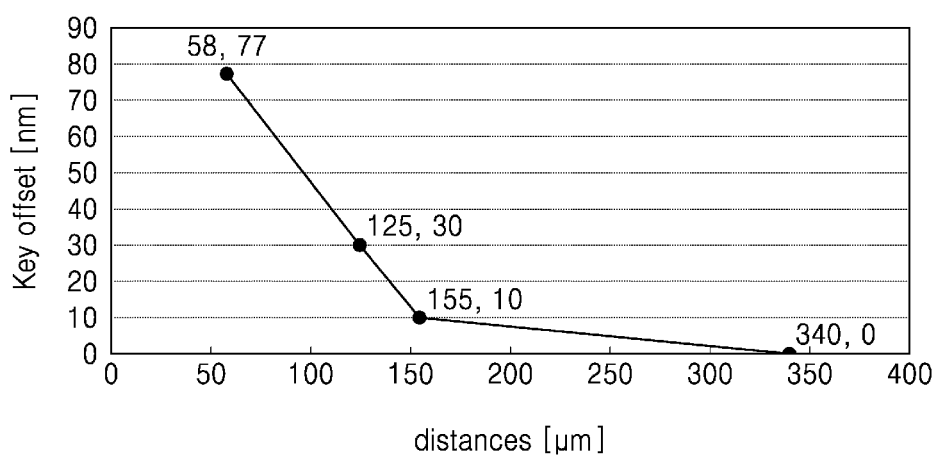
FIG. 11 is a graph for explaining effects of some experimental examples.

FIG. 11 is a graph for explaining effects of some experimental examples. FIG. 11 illustrates a change of the overlay offset according to a change of the distance D in FIG. 2A.

Referring to FIGS. 2A and 11, the overlay offsets are shown for cases where the distances D between the first and second openings OP1 and OP2 are about 58.77 μm, about 125.30 μm, about 155.10 μm, and about 340.0 μm.

Referring to FIG. 11, when the distance D is about 155.10 μm, the overlay offset is about 10 nm, and when the distance is about 340.0 μm or more, the overlay offset is close to about 0 nm. As illustrated in the embodiment of FIG. 2A, by making the distance D between the first and second openings OP1 and OP2 as, for example, at least about 150 μm or more, or at least about 155.10 μm or more, or at least about 200 μm or more, the offset of the overlay may be prevented from occurring.

Recently, with the high integration of semiconductor devices, semiconductor devices having a structure of a high aspect ratio circuit have been increased, and among the semiconductor devices, a NAND flash memory in which memory cell strings of the semiconductor device are vertically stacked has received attention. When a word line contact pad of a vertical cell string is formed, repeated exposure and development processes may be performed, and thus a very high/thick photoresist layer may be beneficial for performing the processes.

According to embodiments of the inventive concept, the asymmetrical developing process may be prevented/avoided by sufficiently separating the overlay marks OVM1 and OVM2 of adjacent full shots FS1 and FS2, or by providing the first and second shields (refer to FIG. 5) that surround the first and second overlay marks OVM1 and OVM2 (refer to FIG. 5). Accordingly, even in the case where a photoresist pattern/layer having a very large height (for example, about 40,000 Å to about 130,000 Å), the overlay offset due to an inclination of a sidewall of an overlay mark may be prevented/improved, and thus the reliability of manufacturing a semiconductor device may be improved.

Figure 12:
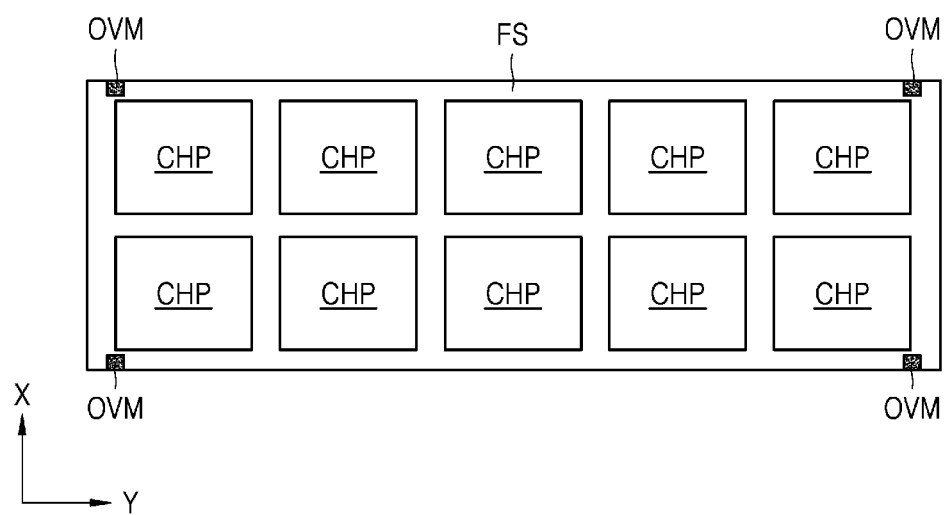
FIG. 12 is a plan view for explaining a method of manufacturing a semiconductor device, according to some embodiments.

FIG. 12 is a plan view of a full shot according to a method of manufacturing a semiconductor device, according to some embodiments.

FIG. 12 schematically illustrates a configuration of one full shot FS. Referring to FIG. 12, the full shot FS may have an approximately rectangular profile. According to some embodiments, the full shot FS may include a plurality of chip regions CHP and a scribe lane SL which is a separation space. Each of the plurality of chip regions CHP may be a region/space where a vertical NAND flash memory is formed.

In one example, a length in the Y direction of the chip region CHP may be about 34 mm, and the length in the X direction may be about 26 mm. Although the chip regions CHP of two rows and five columns are formed in one full shot FS, the chip regions CHP of four to seven columns may be formed in the one full shot FS.

The overlay marks OVM may be respectively adjacent to corners of the full shot FS. The overlay marks OVM may have the same structure as any one of the overlay marks (OVM1, OVM2, OVM1', OVM2', OVM1", and OVM2") described with reference to FIGS. 2A through 7. Although four overlay marks OVM are illustrated in FIG. 12, additional overlay marks OVM may be further arranged along an outer scribe lane SL of the full shot FS.

The full shot FS in FIG. 12 may be any one of the full shots FS in FIG. 1. In general, since a mask used for the exposure process of a full shot FS may be designed separately without considering adjacent full shots FS, the distance between the overlay marks OVM formed by different full shots and arranged on the scribe lane SL that is shared by two adjacent full shots FS may not be previously considered in the mask design.

When two different full shots FS are formed adjacent to each other on the wafer 10, it is proved that the overlay offset may occur when a distance between overlay marks OVM is too close. This is true whether the overlay marks OVM belong to and/or formed by different full shots FS or the same full shots FS. According to some embodiments of the present disclosure, by securing enough distances between the overlay marks OVM, the reliability of overlay measurement and manufacturing the semiconductor device may be improved.

Figure 13:
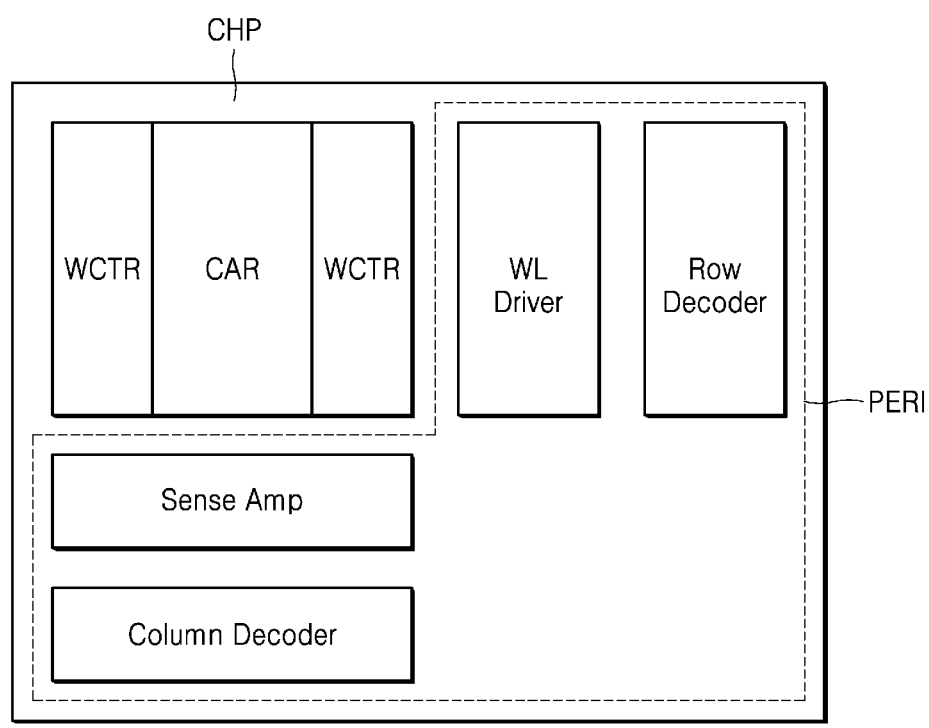
FIG. 13 is a block diagram illustrating a configuration of circuits formed in a chip region in FIG. 12.

FIG. 13 is a block diagram illustrating a configuration of circuits formed in the chip region CHP in FIG. 12.

Referring to FIG. 13, the chip region CHP may include a cell array region CAR, a word line contact region WCTR, and a peripheral circuit region PERI. In the cell array region CAR, memory cells including tertiary cell string arrays, bit lines and word lines for accessing the memory cells may be formed. The word line contact region WCTR may be between the cell array region CAR and the peripheral circuit region PERI. In the word line contact region WCTR, wiring plugs and conductive lines connecting the memory cells to peripheral circuits may be further formed. In the peripheral circuit region PERI, the peripheral circuits for driving the memory cells and reading data stored in the memory cells may be formed. The peripheral circuit may include a word line driver WL driver, a sense amplifier sense amp, a row decoder, a column decoder, and other control circuits.

Figure 14:
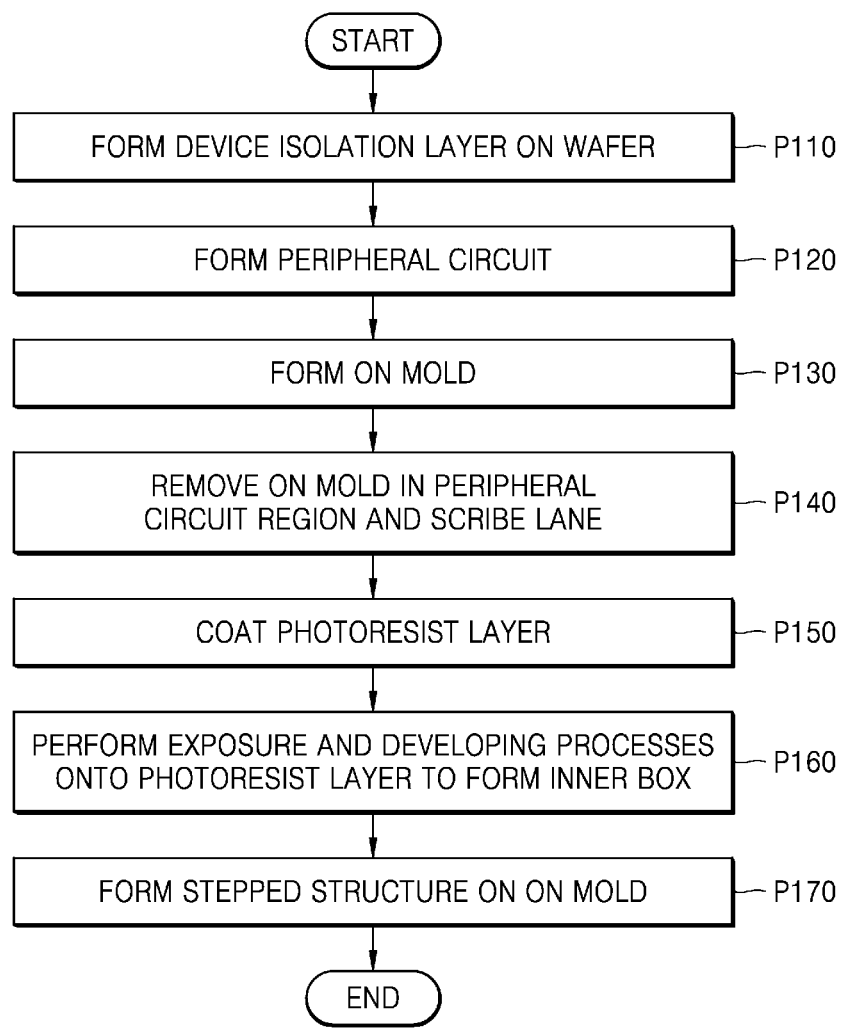
FIG. 14 is a flowchart of a method of manufacturing a semiconductor device, according to some embodiments.

FIG. 14 is a flowchart of a method of manufacturing a semiconductor device, according to some embodiments.

FIGS. 15A through 15G are cross-sectional views illustrating steps of a method of manufacturing a semiconductor device according to some embodiments, and illustrate cross-sectional views of the cell array region CAR, the word line contact region WCTR, the peripheral circuit region PERI, and the scribe lane SL in FIG. 13.

Figure 15A:
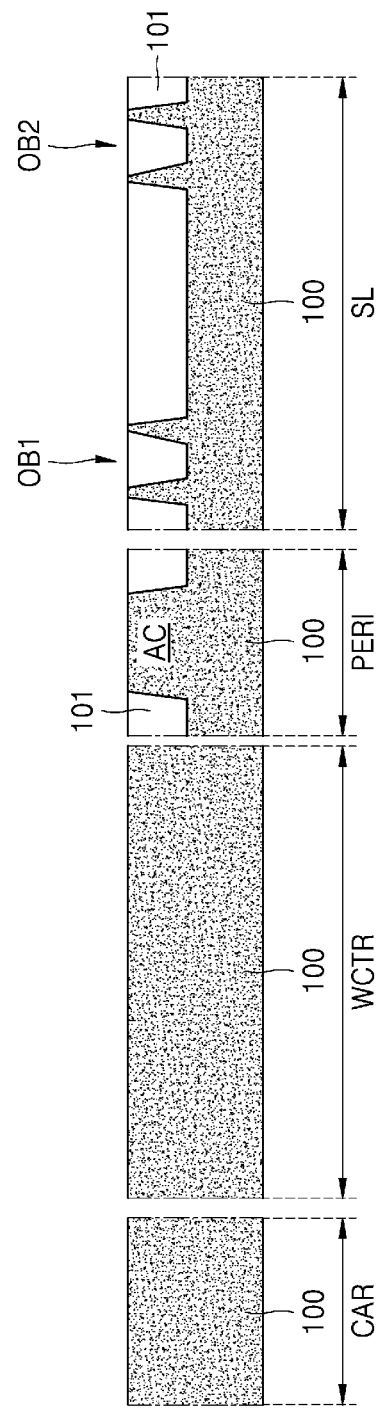
FIGS. 15A and 15G are cross-sectional views illustrating steps of a method of manufacturing a semiconductor device, according to some embodiments.

Referring to FIGS. 14 and 15A, the device isolation layer 101 may be formed on the wafer 100 (P110).

The device isolation layer 101 may be formed by using the STI process. The STI process may include forming isolation trenches in the wafer 100 and filling an inner space of the isolation trenches with an insulating material such as silicon oxide. The active region AC may be defined by using the STI process.

The wafer 100 may include the cell array region CAR, the peripheral circuit region PERI, the word line contact region WCTR, and the scribe lane SL. The wafer 100 and the device isolation layer 101 may be substantially the same as the wafer 10 and the device isolation layer 11 in FIGS. 2A and 2B, respectively.

The first and second outer boxes OB1 and OB2 may be formed by forming the device isolation layer 101. The first and second outer boxes OB1, OB2 may be substantially the same as the ones illustrated in FIGS. 2A and 2B.

Figure 15B:
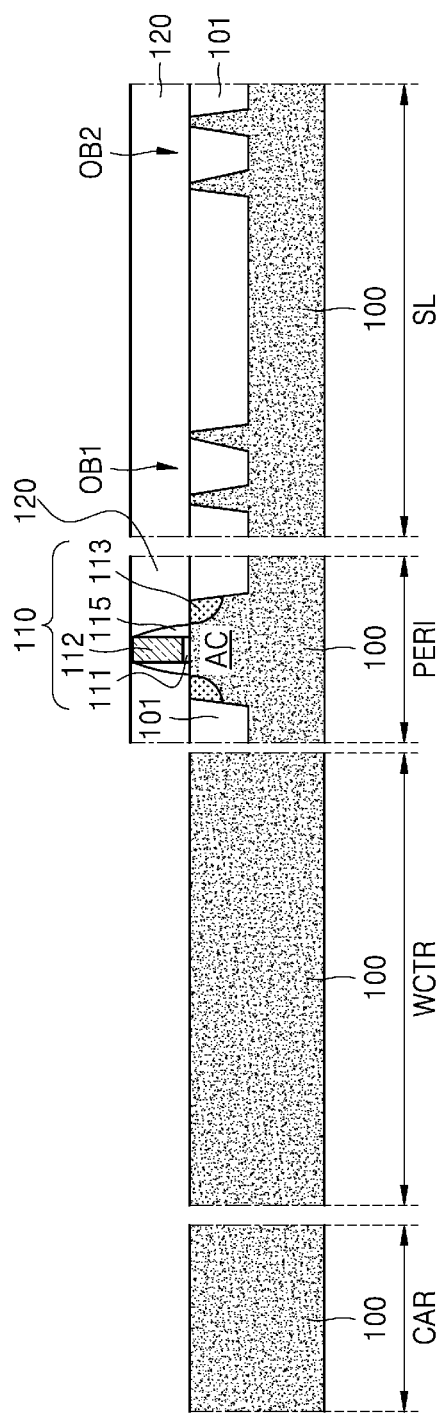

Referring to FIGS. 14 and 15B, the peripheral circuit may be formed (P120).

Forming the peripheral circuits may include forming peripheral transistors 110. The peripheral transistors 110 may include a peripheral gate electrode 112, a peripheral gate insulating pattern 111, a source/drain region 113, and a gate spacer 115.

According to an example embodiment, forming the peripheral circuits may include forming the word line WL driver, the sense amplifier, the row decoder, the column decoder, and the control circuits described with reference to FIG. 13.

The peripheral gate insulating layer and the peripheral gate layer may be sequentially stacked on the wafer 100, and the peripheral gate insulating layer and the peripheral gate layer that are stacked may be patterned, and then the peripheral gate electrodes 112 and the peripheral gate insulating patterns 111 may be formed. The peripheral gate electrodes 112 may include polysilicon doped with impurities or a metal material such as tungsten. The peripheral gate insulating patterns 111 may include silicon oxide formed by using a thermal oxidation process. Next, the source/drain region 113 may be formed in the wafers 100 on both sides of the peripheral gate electrode 112, and the gate spacer 115 may be formed to cover side surfaces of the peripheral gate electrode 112.

After the peripheral transistors 110 are formed, an insulating layer 120 covering the wafer 100 on the scribe lane SL and the peripheral circuit region PERI may be formed. The insulating layer 120 may be formed by providing an insulating material on the entire surface of the wafer 100 and then planarizing the insulating material. The insulating layer 120 may include, for example, silicon oxide. Insulating materials on the cell array region CAR and the word line contact region WCTR may be removed. Accordingly, the insulating layer 120 may be formed only in the peripheral circuit region PERI and the scribe lane SL. The insulating layer 120 may not cover the wafer 100 in the cell array region CAR, the wafer 100 in the word line contact region WCTR, and the device isolation layer 101.

FIGS. 15A and 15B are drawings related to the case where the first and second outer boxes OB1 and OB2 are portions of the wafer 100 exposed by the device isolation layer 101, as in the embodiments in FIGS. 2B, 4, and 5B. However, the embodiment is not limited thereto, and as illustrated in FIG. 3, the first and second outer boxes OB1' and OB2' similar in shape to the gate structure of the peripheral transistor 110 may be provided on the scribe lane. In this case, the first and second outer boxes OB1' and OB2' may be formed in a process of forming the peripheral transistor 110.

Referring to FIGS. 14 and 15C, an ON mold ONM may be formed (P130).

The ON mold ONM may include a plurality of interlayer insulating layers 130 and sacrificial layers 140 that are alternately stacked. For example, eight or more interlayer insulating layers 130 and eight or more sacrificial layers 140 may be alternately stacked on the wafer.

The interlayer insulating layers 130 and the sacrificial layers 140 may include materials having higher etching selectivity between the interlayer insulating layers 130 and the sacrificial layers 140. For example, the interlayer insulating layers 130 may include silicon oxide, and the sacrificial layer 140 may include silicon nitride.

In an example, the lowermost interlayer insulating layer 130 may be formed by using a thermal oxidation process. In this case, the lowermost interlayer insulating layer 130 may have a less thickness than other interlayer insulating layers 130 in the first direction (z direction), but is not limited thereto. According to some other embodiments, all the interlayer insulating layers 130 may be provided by the same process and have the same thickness.

Figure 15D:
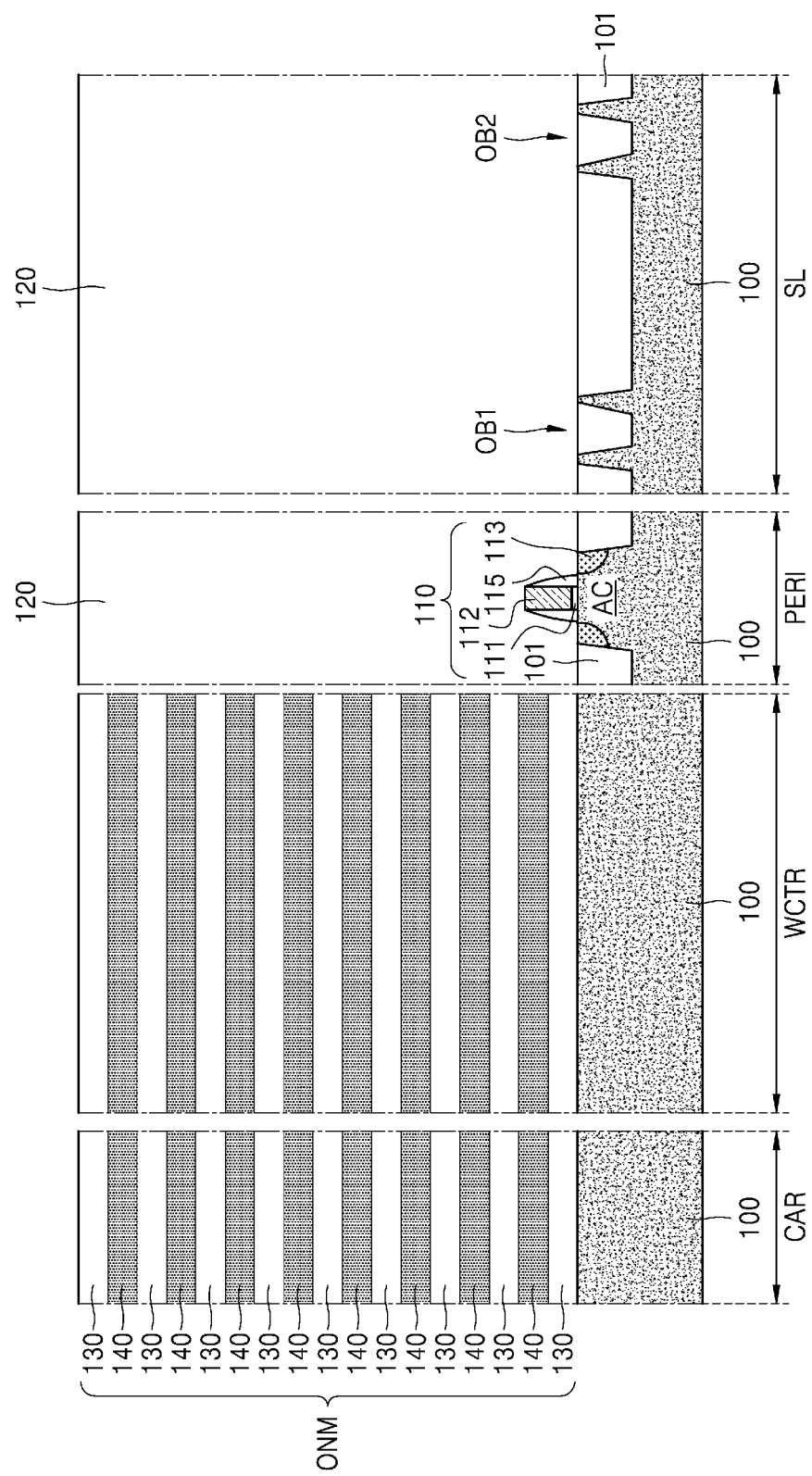

Referring to FIGS. 14 and 15D, the ON mold ONM on the peripheral circuit region PERI and the scribe lane SL may be removed (P140).

A photoresist layer may be formed on the entire surface of the wafer 100, and by removing the photoresist layer on the peripheral circuit region PERI and the scribe lane SL, the ON mold ONM on the peripheral circuit region PERI and the scribe lane SL may be exposed. The exposed portion of the ON mold ONM may be removed by a subsequent etching process.

After the ON mold ONM on the exposed peripheral circuit region PERI and the scribe lane SL is removed, the rest of the photoresist layer may be removed, and an insulating material such as silicon oxide is provided on the entire surface of the wafer 100. The insulating material may be planarized. Accordingly, step differences between the peripheral circuit region PERI and the scribe lane SL, and between the cell array region CAR and the word line contact region may be removed.

Although an insulating material provided on the peripheral circuit region PERI and the scribe lane SL is illustrated as being integrated with the insulating layer 120 in FIG. 15D, an interface may be formed between newly provided insulating materials and existing insulating layers 120 (illustrated in FIG. 15B).

Referring to FIGS. 14 and 15E, a photoresist layer PR may be coated (P150).

The photoresist layer PR may be provided by using a spin coating process or the like. In addition, an organic planarization layer, an anti-reflection coating layer, a top coating layer, and the like may be further formed at the time of coating the photoresist layer PR, and an EBR process may be further performed.

Figure 15F:
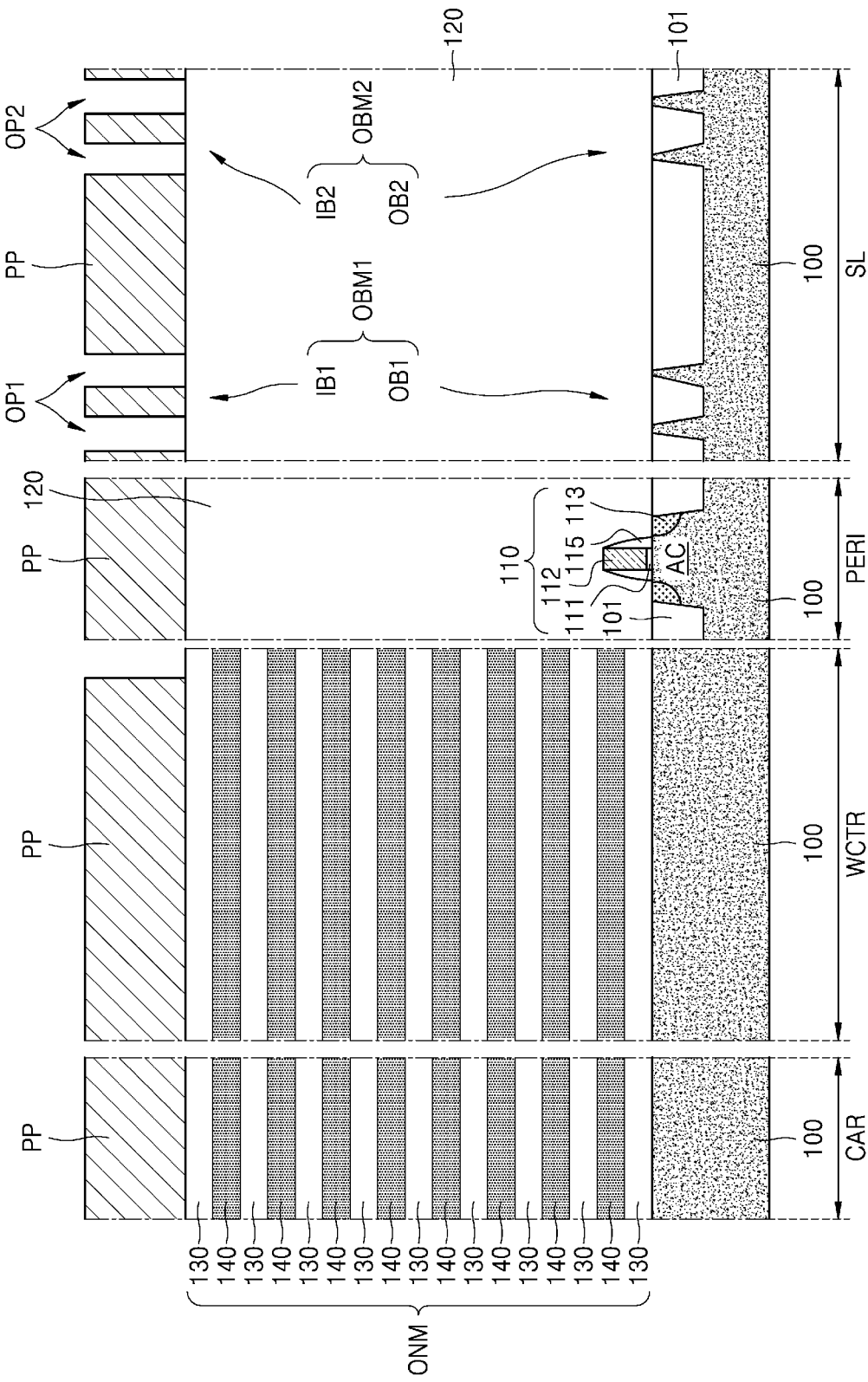

Referring to FIGS. 14, 15E, and 15F, an exposure process and a developing process may be performed on the photoresist layer PR to form an inner box (P160).

A photoresist pattern PP may be formed by using the exposure and developing processes. The photoresist pattern PP may cover the cell array region CAR and the peripheral circuit region PERI.

The photoresist pattern PP formed on the word line contact region WCTR may include a pattern for forming a stepped word line pad.

The photoresist pattern PP formed on the scribe lane SL may include the first and second inner boxes IB1 and IB2. The first and second inner boxes IB1 and IB2 may have a structure substantially the same as at least one of the inner boxes described with reference to FIGS. 2A through 7.

Referring to FIGS. 14 and 15G, a stepped structure ST may be formed in the ON mold ONM (P170). The stepped structure ST may be formed by repeated etching processes on the ON mold ONM in the word line contact region WCTR.

Subsequently, by using any publically known method, a vertical channel structure may be formed, and the sacrificial layers 140 may be replaced by the gate electrodes, and accordingly, the vertical NAND flash memory may be provided.

In FIGS. 15A through 15G, an embodiment is illustrated in which the peripheral circuit region PERI is horizontally apart from the cell array region CAR. However, one with an ordinary skill in the art will be easily able to apply the contents described in the present specification to a cell on per1 (COP) in which the peripheral circuit region is vertically superimposed on the cell array region.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor device, the method comprising:
   forming a first outer box and a second outer box on a wafer;
   forming an insulating layer covering the first outer box and the second outer box;
   providing a photoresist layer on the insulating layer; and
   forming a photoresist pattern by exposing and developing the photoresist layer,
   wherein the photoresist pattern comprises:
   a first opening exposing a portion of a top surface of the insulating layer, the first opening having a square shape in a top view;
   a first inner box disposed in the first opening;
   a first shield exposing a portion of a top surface of the insulating layer and surrounding the first opening;
   a second opening horizontally apart from the first opening and having a square shape in a top view, the second opening exposing a portion of the top surface of the insulating layer; and
   a second inner box disposed in the second opening,
   wherein a horizontal width of the photoresist between the first opening and the second opening is substantially constant.

2. The method of claim 1, further comprising a second shield exposing a portion of the top surface of the insulating layer and surrounding the second opening.

3. The method of claim 2, wherein the first shield and the second shield have square shapes in the top view.

4. The method of claim 1, wherein the first shield further surrounds the second opening.

5. The method of claim 1, wherein the first outer box and the second outer box are formed with portions of the wafer, and are formed by using a shallow trench isolation (STI) process.

6. The method of claim 1, wherein the first outer box and the second outer box are formed on a top surface of the wafer.

7. A method of manufacturing a semiconductor device, the method comprising:
   providing a wafer on which a first full shot, a second full shot, and a scribe lane between the first full shot and the second full shot are defined, wherein a first cell array region, a first word line contact region, and a first peripheral circuit region are defined in the first full shot, and a second cell array region, a second word line contact region, and a second peripheral circuit region are defined in the second full shot;
   defining an active region on the wafer by using a shallow trench isolation (STI) process;
   forming peripheral transistors in the first peripheral circuit region and the second peripheral circuit region;
   providing an ON mold in which eight or more interlayer insulating layers and eight or more sacrificial layers are alternately stacked on the wafer;
   providing a photoresist layer on the wafer; and
   forming a photoresist pattern by performing exposing and developing processes onto the photoresist layer,
   wherein the photoresist pattern includes a first opening defining a first inner box and a second opening defining a second inner box,
   the first opening and the second opening are formed on the scribe lane, and a distance between the first opening and the second opening is about 150 μm to about 400 μm.

8. The method of claim 7, wherein, in the defining of the active region, a first outer box vertically superimposed on the first inner box and a second outer box vertically superimposed on the second inner box are further formed.

9. The method of claim 7, wherein, in the forming of the peripheral transistors, a first outer box vertically superimposed on the first inner box and a second outer box vertically superimposed on the second inner box are further formed.

10. The method of claim 7, further comprising forming a stepped structure in the ON mold on the first word line contact region and the second word line contact region by using the photoresist pattern.

11. The method of claim 7, wherein a height of the photoresist pattern is about 40,000 Å to about 130,000 Å.

12. The method of claim 7, further comprising measuring a first overlay and second overlay, wherein the first overlay of the first full shot is measured by using the first inner box and the second overlay of the second full shot is measured by using the second inner box.

13. A method of manufacturing a semiconductor device, the method comprising:
   forming a first outer box on a wafer;
   forming an insulating layer covering the first outer box;
   providing a photoresist layer on the insulating layer; and
   forming a photoresist pattern by exposing and developing the photoresist layer,
   wherein the photoresist pattern comprises:
   a first opening exposing a portion of a top surface of the insulating layer, the first opening having a square shape in a top view;
   a first inner box disposed in the first opening; and
   a first shield exposing a portion of the top surface of the insulating layer and surrounding the first opening; and wherein the first shield horizontally surrounds the first outer box in a top view.

14. The method of claim 13, wherein a second outer box covered by the insulating layer is formed on the wafer by forming the first outer box, and wherein the photoresist pattern further comprises:

a second opening horizontally apart from the first opening and having a square shape in a top view, the second opening exposing a portion of the top surface of the insulating layer; and a second inner box disposed in the second opening.

15. The method of claim 14, further comprising forming a second shield exposing a portion of the top surface of the insulating layer and surrounding the second opening.

16. The method of claim 15, wherein the first shield and the second shield each have a square shape in a top view.

17. The method of claim 14, wherein a horizontal width of the photoresist pattern between the first opening and the second opening is substantially constant.

18. The method of claim 14, wherein the first shield further surrounds the second opening.

19. The method of claim 14, wherein the first outer box and the second outer box are formed with portions of the wafer by using a shallow trench isolation (STI) process.

20. The method of claim 14, wherein the first outer box and the second outer box are formed on a top surface of the wafer.

* * * * *